US010068992B2

(12) United States Patent
Lo et al.

(10) Patent No.: US 10,068,992 B2
(45) Date of Patent: Sep. 4, 2018

(54) SEMICONDUCTOR DEVICE INCLUDING FIN FET AND MANUFACTURING METHOD THEREOF

(71) Applicant: TAIWAN SEMICONDUCTOR MANUFACTURING CO., LTD., Hsinchu (TW)

(72) Inventors: Hung Lo, Hsinchu (TW); Tzu-Hsiang Hsu, Hsinchu County (TW); Chia-Jung Hsu, Changhua County (TW); Feng-Cheng Yang, Hsinchu County (TW); Teng-Chun Tsai, Hsinchu (TW); Ying-Ho Chen, Taipei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 15/590,301

(22) Filed: May 9, 2017

(65) Prior Publication Data
US 2017/0243957 A1  Aug. 24, 2017

Related U.S. Application Data

(62) Division of application No. 14/856,547, filed on Sep. 16, 2015, now Pat. No. 9,680,017.

(51) Int. Cl.
*H01L 21/82* (2006.01)
*H01L 29/66* (2006.01)
(Continued)

(52) U.S. Cl.
CPC .. *H01L 29/66795* (2013.01); *H01L 21/76224* (2013.01); *H01L 21/823807* (2013.01);
(Continued)

(58) Field of Classification Search
CPC ......... H01L 29/66795; H01L 21/76224; H01L 21/823807; H01L 21/845; H01L 29/785; H01L 29/6656
See application file for complete search history.

(56) References Cited

U.S. PATENT DOCUMENTS 7,425,740 B2   9/2008   Liu et al.
7,667,271 B2   2/2010   Yu et al.
(Continued)

FOREIGN PATENT DOCUMENTS

KR   10-0496891 B1   6/2005

OTHER PUBLICATIONS

Non-Final Office Action U.S. Appl. No. 14/579,708 dated Jan. 26, 2017.
(Continued)

*Primary Examiner* — Julia Slutsker
(74) *Attorney, Agent, or Firm* — McDermott Will & Emery LLP

(57) ABSTRACT

A semiconductor device includes a fin structure for a fin field effect transistor (FET). The fin structure includes a base layer protruding from a substrate, an intermediate layer disposed over the base layer and an upper layer disposed over the intermediate layer. The fin structure further includes a first protective layer and a second protective layer made of a different material than the first protective layer. The intermediate layer includes a first semiconductor layer disposed over the base layer, the first protective layer covers at least side walls of the first semiconductor layer and the second protective layer covers at least side walls of the first protective layer.

21 Claims, 27 Drawing Sheets

(51) Int. Cl.
*H01L 21/762* (2006.01)
*H01L 21/8238* (2006.01)

(52) U.S. Cl.
CPC ............. *H01L 21/823821* (2013.01); *H01L 21/823878* (2013.01)

(56) References Cited

U.S. PATENT DOCUMENTS

| | | | |
|---|---|---|---|
| 8,048,723 | B2 | 11/2011 | Chang et al. |
| 8,053,299 | B2 | 11/2011 | Xu |
| 8,183,627 | B2 | 5/2012 | Currie |
| 8,362,575 | B2 | 1/2013 | Kwok et al. |
| 8,367,498 | B2 | 2/2013 | Chang et al. |
| 8,415,718 | B2 | 4/2013 | Xu |
| 8,440,517 | B2 | 5/2013 | Lin et al. |
| 8,497,177 | B1 | 7/2013 | Chang et al. |
| 8,497,528 | B2 | 7/2013 | Lee et al. |
| 8,609,518 | B2 | 12/2013 | Wann et al. |
| 8,610,240 | B2 | 12/2013 | Lee et al. |
| 8,618,556 | B2 | 12/2013 | Wu et al. |
| 8,633,516 | B1 | 1/2014 | Wu et al. |
| 8,680,576 | B2 | 3/2014 | Ching et al. |
| 8,703,565 | B2 | 4/2014 | Chang et al. |
| 8,723,272 | B2 | 5/2014 | Liu et al. |
| 8,729,627 | B2 | 5/2014 | Cheng et al. |
| 8,729,634 | B2 | 5/2014 | Shen et al. |
| 8,742,509 | B2 | 6/2014 | Lee et al. |
| 8,776,734 | B1 | 7/2014 | Roy et al. |
| 8,785,285 | B2 | 7/2014 | Tsai et al. |
| 8,796,666 | B1 | 8/2014 | Huang et al. |
| 8,796,759 | B2 | 8/2014 | Perng et al. |
| 8,809,139 | B2 | 8/2014 | Huang et al. |
| 8,815,712 | B2 | 8/2014 | Wan et al. |
| 8,828,823 | B2 | 9/2014 | Liu et al. |
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 2005/0035391 | A1 | 2/2005 | Lee et al. |
| 2007/0221956 | A1* | 9/2007 | Inaba ............... H01L 21/823807 257/197 |
| 2011/0068407 | A1 | 3/2011 | Yeh et al. |
| 2011/0108920 | A1 | 5/2011 | Basker et al. |
| 2013/0011983 | A1 | 1/2013 | Tsai et al. |
| 2013/0196478 | A1 | 8/2013 | Chang et al. |
| 2013/0285153 | A1 | 10/2013 | Lee et al. |
| 2014/0138770 | A1 | 5/2014 | van Dal et al. |
| 2014/0183600 | A1 | 7/2014 | Huang et al. |
| 2014/0197457 | A1 | 7/2014 | Wang et al. |
| 2014/0227858 | A1* | 8/2014 | Shen ................. H01L 21/76224 438/430 |
| 2014/0252412 | A1 | 9/2014 | Tsai et al. |
| 2014/0264590 | A1 | 9/2014 | Yu et al. |
| 2014/0264592 | A1 | 9/2014 | Oxland et al. |
| 2014/0335673 | A1 | 11/2014 | Kim et al. |
| 2015/0097239 | A1 | 4/2015 | Chen et al. |
| 2015/0228499 | A1 | 8/2015 | Parkinson et al. |
| 2016/0013184 | A1* | 1/2016 | Alptekin ............ H01L 27/0886 257/401 |
| 2016/0035872 | A1 | 2/2016 | Loubet et al. |

OTHER PUBLICATIONS

Non-Final Office Action U.S. Appl. No. 14/856,547 dated Sep. 21, 2016.
Office Action Korean Patent Application No. 10-2015-0153888 dated Oct. 5, 2016 with English translation.
Notice of Allowance U.S. Appl. No. 14/856,547 dated Feb. 14, 2017.
Notice of Allowance U.S. Appl. No. 14/579,708 dated Mar. 30, 2016.
Office Action Taiwan Patent Application No. 10520857580 dated Jul. 13, 2016.
Non-Final Office Action issued in corresponding parent U.S. Appl. No. 15/693,171, dated Jan. 12, 2018.

\* cited by examiner

SEMICONDUCTOR DEVICE INCLUDING FIN FET AND MANUFACTURING METHOD THEREOF

CROSS-REFERENCE TO RELATED APPLICATIONS

This application is a Divisional Application of U.S. Ser. No. 14/856,547 filed Sep. 16, 2015, the subject matter of which is incorporated herein by reference in entirety.

TECHNICAL FIELD

The disclosure relates to a semiconductor integrated circuit, to more particularly to a semiconductor device with a fin field effect transistor (FET) and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin devices (e.g., wrapping) utilizing the advantage of the increased surface area of the channel and source/drain regions to produce faster, more reliable and better-controlled semiconductor transistor devices.

In addition, strained materials in source/drain (S/D) portions of the Fin FET utilizing selectively grown silicon germanium (SiGe) may be used to enhance carrier mobility. For example, compressive stress applied to a channel of a PMOS device advantageously enhances hole mobility in the channel. Similarly, tensile stress applied to a channel of an NMOS device advantageously enhances electron mobility in the channel.

However, there are challenges to implementation of such features and processes in complementary metal-oxide-semiconductor (CMOS) fabrication.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

Figure 1:
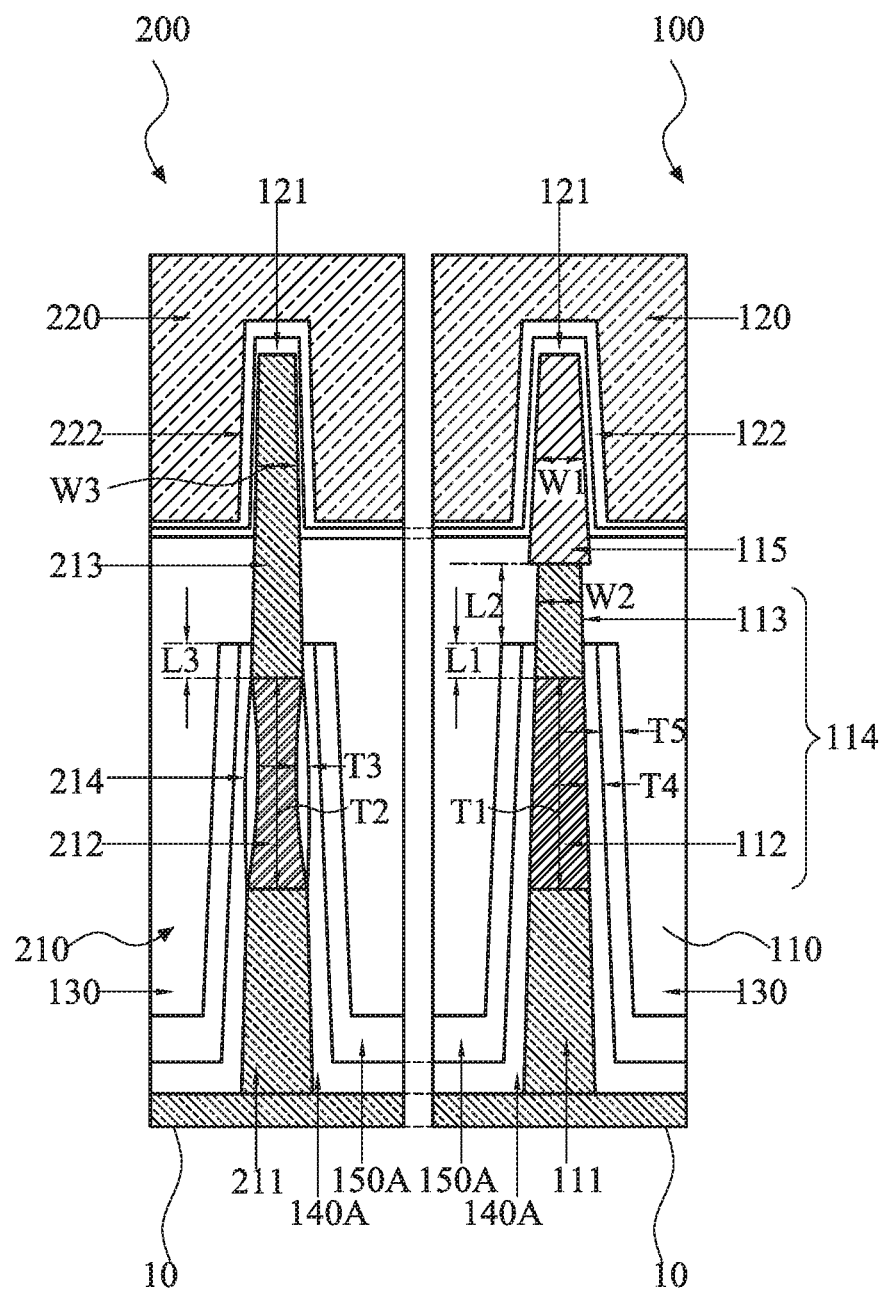
FIG. 1 is an exemplary cross sectional view of the Fin FET device according to one embodiment of the present disclosure.

FIG. 1 shows an exemplary cross sectional view of the Fin FET device according to one embodiment of the present disclosure. The Fin FET device includes an n-channel Fin FET 200 and a p-channel Fin FET 100. Although the n-channel Fin FET 200 and the p-channel Fin FET 100 are separately illustrated in the drawings, the n-channel Fin FET 200 and the p-channel Fin FET 100 are disposed in the same semiconductor device, and some layers are continuously formed in a p-channel Fin FET region and an n-channel Fin FET region.

A first fin structure 110 of the p-channel Fin FET 100 includes a first base layer 111 protruding from a substrate 10, a first intermediate layer 114 disposed over the first base layer 111, and a first channel layer 115 (p-channel layer) disposed over the first intermediate layer 114. In this embodiment, the substrate 10 is a silicon substrate. Alternatively, the substrate 10 may comprise a compound semiconductor including IV-IV compound semiconductors such as SiC and SiGe, another elementary semiconductor, such as germanium; III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. An amorphous substrate such as amorphous Si or amorphous SiC, or insulators such as silicon oxide may also be used as the substrate 10. The substrate 10 may include various regions that have been suitably doped (e.g., p-type or n-type conductivity).

The first base layer 111 may be made of the same material as the substrate 10 and may continuously extend from the substrate 10. The first intermediate layer 114 includes a first semiconductor layer 112 disposed over the first base layer 111 and a second semiconductor layer 113, which is a first strain layer, disposed over the first semiconductor layer 112. In some embodiments, the first semiconductor layer 112 includes Ge or a Ge compound such as doped or un-doped SiGe and the second semiconductor layer 113 is a Si layer or a silicon compound layer. The width W2 of the second semiconductor layer 113 is in a range from about 10 nm to about 20 nm in some embodiments. The first channel layer 115 is made of Ge or a Ge compound such as doped or un-doped SiGe in some embodiments. Because of the hetero structure of the Si strain layer 113 and the first channel layer 115, a compressive stress is applied to a channel of the p-channel Fin FET. The thickness T1 of first semiconductor layer 112 is in a range from about 20 nm to about 50 nm in some embodiments. The average width of the channel layer 115 is greater than the average width of the first strain layer 113 in some embodiments. At the interface between the first strain layer 113 and the channel layer 115, the width of the channel layer 115 is greater than the width of the first strain layer 113. In some embodiments, the average width of the channel layer 115 is equal to or smaller than the average width of the first strain layer 113.

A second fin structure 210 of the n-channel Fin FET 200 includes a second base layer 211 protruding from the substrate 10, a second strain layer 212 disposed over the second base layer 211 and a second channel layer 213 (n-channel layer) disposed over the second strain layer 212. The second base layer 211 may be made of the same material as the substrate 10 and may continuously extend from the substrate 10. The second strain layer 212 is made of Ge or a Ge compound such as doped or un-doped SiGe and the second channel layer 213 is made of Si in some embodiments. The width W3 of the channel layer 213 is in a range from about 10 nm to about 15 nm in some embodiments. Because of the hetero structure of the second strain layer 212 and the Si channel layer 213, a tensile stress is applied to a channel of the n-channel Fin FET. The thickness T2 of the second strain layer 212 is in a range from about 20 nm to about 50 nm in some embodiments.

In the n-channel Fin FET 200 of the present disclosure, the second strain layer 212 further includes SiGe oxide layers 214 disposed over the side walls of the second strain layer 212. The SiGe oxide layers 214 induce an additional tensile stress to the second channel layer 213. The thickness T3 of the SiGe oxide layer 214 is in a range from about 5 nm to about 10 nm in some embodiments. Since oxygen diffuses faster at the center of the SiGe layer, and thus the center of the SiGe layer is oxidized faster, the SiGe oxide layer 214 becomes an "eye" shape as shown in FIG. 1.

As shown in FIG. 1, the p-channel Fin FET 100 further includes a first protective layer 140A and a second protective layer 150A. The first protective layer 140A for the p-channel Fin FET covers the side walls of the first base layer 111 and the side walls of the first semiconductor layer 112, but covers only a part of the side walls of the strain layer 113. The second protective layer 150A covers the side walls of the first protective layer 140A. As a result, the first protective layer 140A and second protective layer 150A are spaced apart from the first channel layer 115A.

The distance (length L1) that the first protective layer 140A covers the part of the side walls of the strain layer 113 is in a range from about 5 nm to about 20 nm to effectively protect the first semiconductor layer 112 in some embodiments. In certain embodiments, this distance is about 15-18 nm. The distance (space L2) between the first protective layer 140A and the first channel layer 115 is in a range from about 15 nm to about 30 nm in some embodiments.

Similarly, the n-channel Fin FET 200 includes the first protective layer 140A and the second protective layer 150A. The first protective layer 140A and second protective layer 150A of the n-channel Fin FET 200 cover only the bottom portion of the strain layer 213 by a distance (length L3) in a range from about 5 nm to about 20 nm in some embodiments. The second protective layer 150A covers the side walls of the first protective layer 140A. In this embodiment, the first protective layer 140A for the n-channel Fin FET 200 and the p-channel Fin FET 100 is formed at the same time by the same film forming operation. However, the first protective layer may be separately formed for each of the n-channel Fin FET 200 and the p-channel Fin FET 100. Similarly, the second protective lay 150A may be separately formed for each of the n-channel Fin FET 200 and the p-channel Fin FET 100.

In this embodiment, the height of the first protective layer 140A of the p-channel Fin FET 100 is substantially equal to the height of the first protective layer 140A of the n-channel Fin FET 200. Here, "substantially equal" means that a difference is less than 2-3 nm. When the depths of the fin structures are not uniform, the height from the substrate may be measured from the plane that corresponds to the average depths of the fin structures.

In the present disclosure, the shape of the fin structure in the cross section is a tapered shape (e.g., trapezoid). However, the shape is not limited to trapezoid. In some embodiments, the shape of the fin structure in the cross section is reverse trapezoid, rectangular, mesa, or a mixture thereof. A part of the fin structure (e.g., base layer, intermediate layer, strain layer and/or channel layer) may be tapered and/or rectangular. Further, the corners of the fin structures, for example the corners of channel layers, may be rounded.

Each layer of the fin structures is doped with appropriate impurities. For p-channel Fin FET 100, the channel layer 115 is doped with boron (B) or $BF_2$, and for n-channel Fin FET 200, the channel layer 213 is doped with arsenic and/or phosphorous.

The first fin structure 110 of the p-channel Fin FET 100 and the second fin structure 210 of the n-channel Fin FET 200 are electrically isolated from each other and from adjacent devices by isolation insulating layers 130, respectively. This isolation is called an STI (shallow trench isolation). The isolation insulating layers 130 include one or more layers of insulating materials such as silicon dioxide formed by, for example, a flowable chemical vapor deposition (CVD) in some embodiments.

The p-channel Fin FET 100 further includes a gate dielectric layer 121 and a first gate electrode 120 disposed over the first channel layer 115. A width W1 of the first channel layer 115 covered by the gate electrode 120 may be in a range from about 10 nm to about 20 nm in some embodiments. The n-channel Fin FET 200 also includes the gate dielectric layer 121 and a second gate electrode 220 disposed over the second channel layer 213. A width W3 of the second channel (n-channel) layer 213 covered by the gate electrode 220 is in a range from about 10 nm to about 15 nm in some embodiments. The material of the gate dielectric layer for the p-channel FET and n-channel FET are different in some embodiments.

The gate dielectric layer 121 may include one or more layers of dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof.

The gate electrodes 120 and 220 may include one or more layers of suitable conductive materials, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate structure may be formed using a gate-last or replacement gate methodology.

In certain embodiments of the present disclosure, work function adjustment layers 122 and 222 are interposed between the gate dielectric layers 121 and the gate electrode 120, 220. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel Fin FET, one or more of TaN, TaAlC, TiN, TiC, Co, TiAl, HfTi, TiSi and TaSi is used as the work function adjustment layer, and for the p-channel Fin FET, one or more of TiAlC, Al, TiAl, TaN, TaAlC, TiN, TiC and Co is used as the work function adjustment layer.

FIGS. 2-14 show cross sectional views of exemplary sequential process of manufacturing the Fin FET device according to one embodiment. It is understood that additional operations can be provided before, during, and after processes shown by FIGS. 2-14, and some of the operations described below can be replaced or eliminated, in other embodiments of the method. The order of the operations/processes may be interchangeable.

Figure 2:
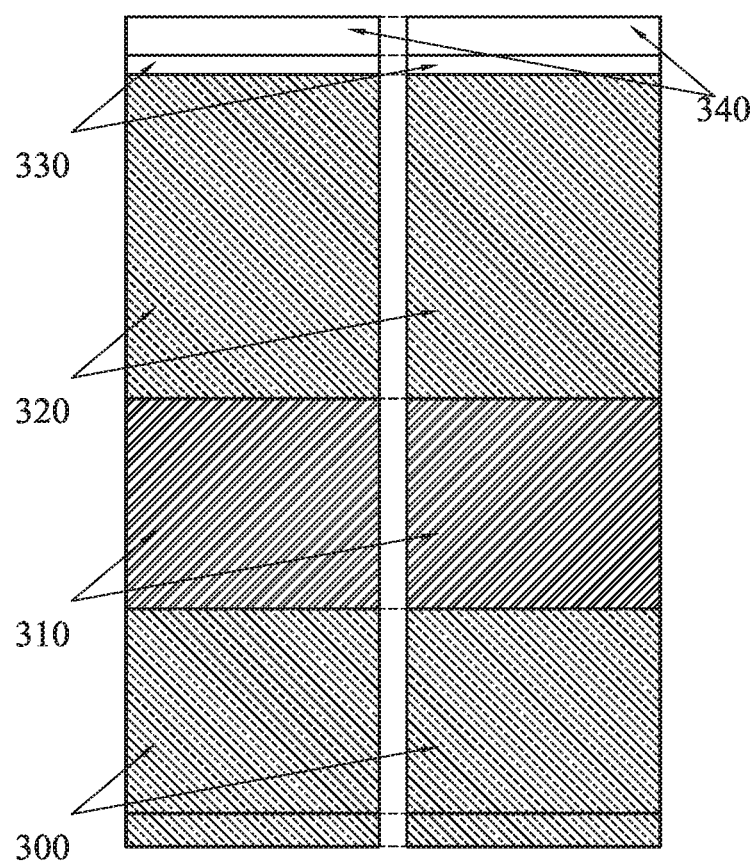
FIGS. 2-14 show exemplary processes for manufacturing the Fin FET device according to an embodiment of the present disclosure.

As shown in FIG. 2, a stacked layer of a base layer 300, an intermediate semiconductor layer 310 and an upper semiconductor layer 320 is provided. In one embodiment, the base layer 300 is silicon, the intermediate semiconductor layer 310 is a SiGe layer and the upper semiconductor layer 320 is silicon. The silicon base layer 300 is a silicon substrate or a silicon layer of an SOI (silicon-on insulator) substrate. The SiGe intermediate layer 310 is an epitaxially grown layer and expressed as $Si_xGe_{(1-x)}$, where x is in a range from about 0.1 to about 0.9. The thickness of the SiGe intermediate layer 310 is in a range from about 20 nm to about 50 nm in some embodiments. The Si upper layer 320 is an epitaxial grown layer and has a thickness in a range from about 60 nm to about 100 nm in some embodiments. In certain embodiments, the thickness of the Si upper layer 320 is in a range from about 75 nm to about 95 nm.

As shown in FIG. 2, a mask layer is further formed over the upper semiconductor layer 320. The mask layer includes, for example, a pad oxide (e.g., silicon oxide) layer 330 and a silicon nitride mask layer 340 in some embodiments. The thickness of the pad oxide layer 330 is in a range from about 2 nm to about 15 nm and the thickness of the silicon nitride mask layer 340 is in a range from about 10 nm to about 50 nm in some embodiments.

Figure 3:
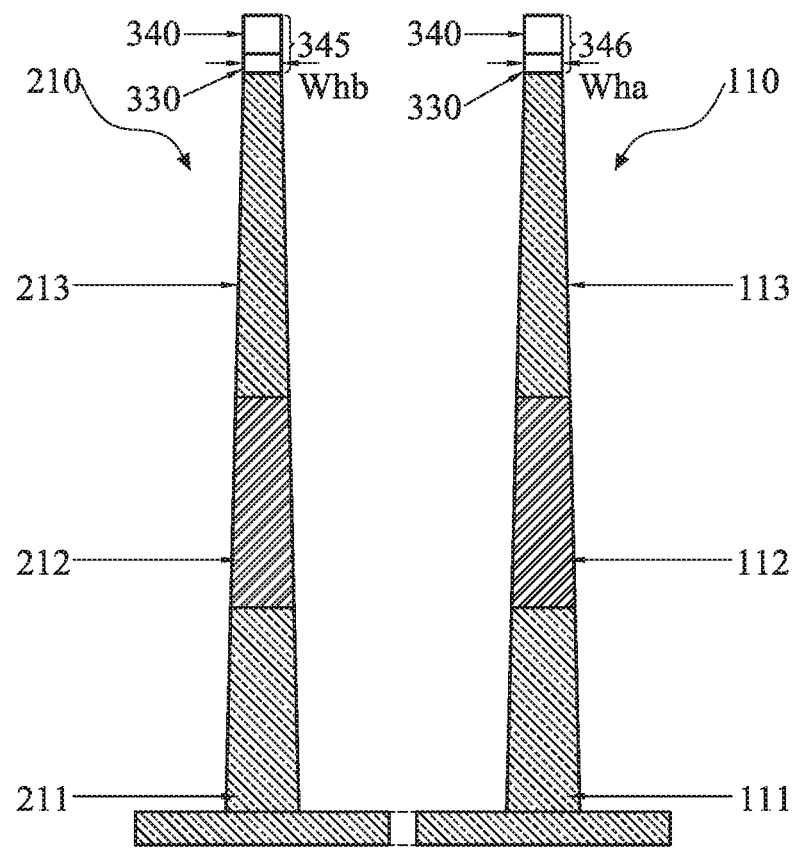

By using a patterning process, hard mask pattern 345 of the pad oxide layer 330 and the silicon nitride mask layer 340 of the second fin structure 210 is formed, as shown in FIG. 3. Hard mask pattern 346 of the pad oxide layer 330 and the silicon nitride mask layer 340 of the first fin structure 110 is formed. The width (length Whb) of the hard mask patterns 345 is in a range from about 6 nm to about 18 nm in some embodiments. In certain embodiments, the width Whb of the hard mask patterns 345 is in a range from about 8 nm to about 10 nm. The width (length Wha) of the hard mask patterns 346 is in a range from about 6 nm to about 18 nm in some embodiments. In certain embodiments, the width Wha of the hard mask patterns 346 is in a range from about 8 nm to about 10 nm.

As shown in FIG. 3, by using the hard mask patterns 345 and 346 as etching masks, the Si base layer 300, the SiGe intermediate layer 310 and the Si upper layer 320 are pattered into fin structures 110, 210 by trench etching using a dry etching method and/or a wet etching method.

Figure 4:
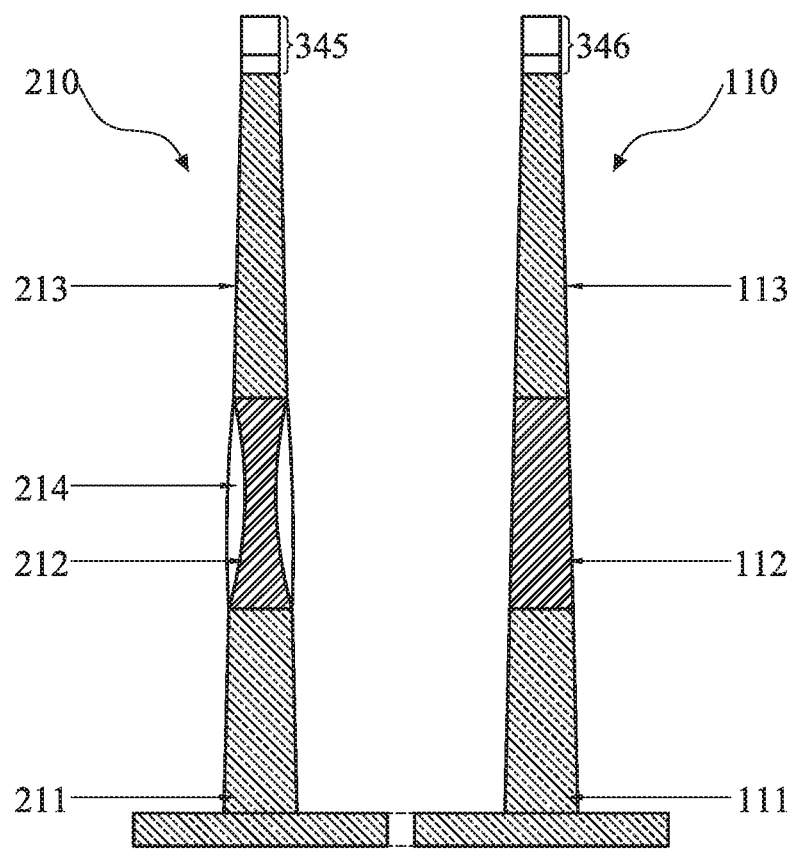

As shown in FIG. 4, side walls of the second strain layer 212 for the n-channel fin structure are oxidized to form SiGe oxide layers 214. To selectively oxidize the second strain layer 212 of the second fin structure 210, the first fin structure 110 for the p-channel Fin FET is covered by a silicon nitride layer (not shown). Then, the second strain layer 212 is selectively oxidized. Although the Si base layer 211 and the Si upper layer 213 are also oxidized, since SiGe (in particular Ge) is oxidized faster than Si, SiGe oxide layers 214 can be selectively formed. The second strain layer 212 can be oxidized by an annealing or heating in an atmosphere containing oxygen ($O_2$), $O_2$ and hydrogen ($H_2$) or steam ($H_2O$), at a temperature in a range from about 300° C. to about 1000° C. in some embodiments. After the second strain layer 212 is selectively oxidized, the silicon nitride layer covering the p-channel fin structure is removed, for example, by dry etching or wet etching. Since oxygen diffuses faster at the center of the SiGe layer, and thus the center of the SiGe layer is oxidized faster, the SiGe oxide layer 214 becomes an "eye" shape as shown in FIG. 4.

Figure 5:
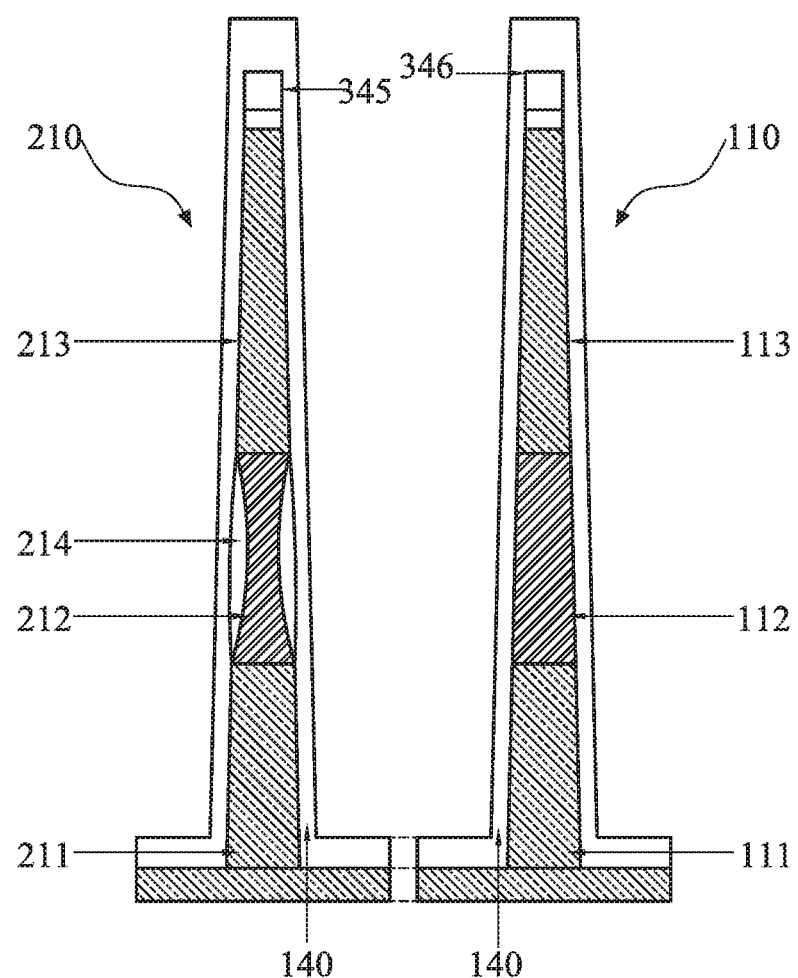

As shown in FIG. 5, first protective layer 140 is formed to cover the first fin structure 110 and the second fin structure 210, respectively. The first protective layer 140 may include one or more layers of dielectric material that prevents an underlying layer from oxidizing. In the present embodiment, silicon nitride (SiN) is used as the first protective layer 140. SiON, SiCN, SiOCN or SiC may also be used as the first protective layer 140. The SiN layer may be deposited by physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer deposition (ALD), and/or other processes. In a LPCVD or plasma CVD process, a silicon source such as $Si_2H_6$, $SiH_4$ and/or $Si_2Cl_6$ and a nitrogen source such as $NH_3$ and/or $N_2$ are used and the SiN film is formed at a temperature in a range from about a room temperature to about 1000° C. under a reduced pressure in a range from about 0.01 to 10 Torr (about 1.33 Pa to about 1333 Pa) in some embodiments. The thickness of the first protective layer 140 is in a range from about 2 nm to about 6 nm in some embodiments.

The first protective layer 140 protects the first semiconductor layer 112 and the second strain layer 212 from the subsequent processes, e.g., an STI formation. As long as the side walls of the first semiconductor layer 112 and the second strain layer 212 are fully covered by the first protective layer 140, the first protective layer 140 does not necessarily cover the entire side walls of the Si base layer 111, 211 and the Si upper layer 113, 213. In other words, the first protective layer 140 may partially cover the side walls of the Si base layer 111, 211 and the Si upper layer 113, 213.

Figure 6:
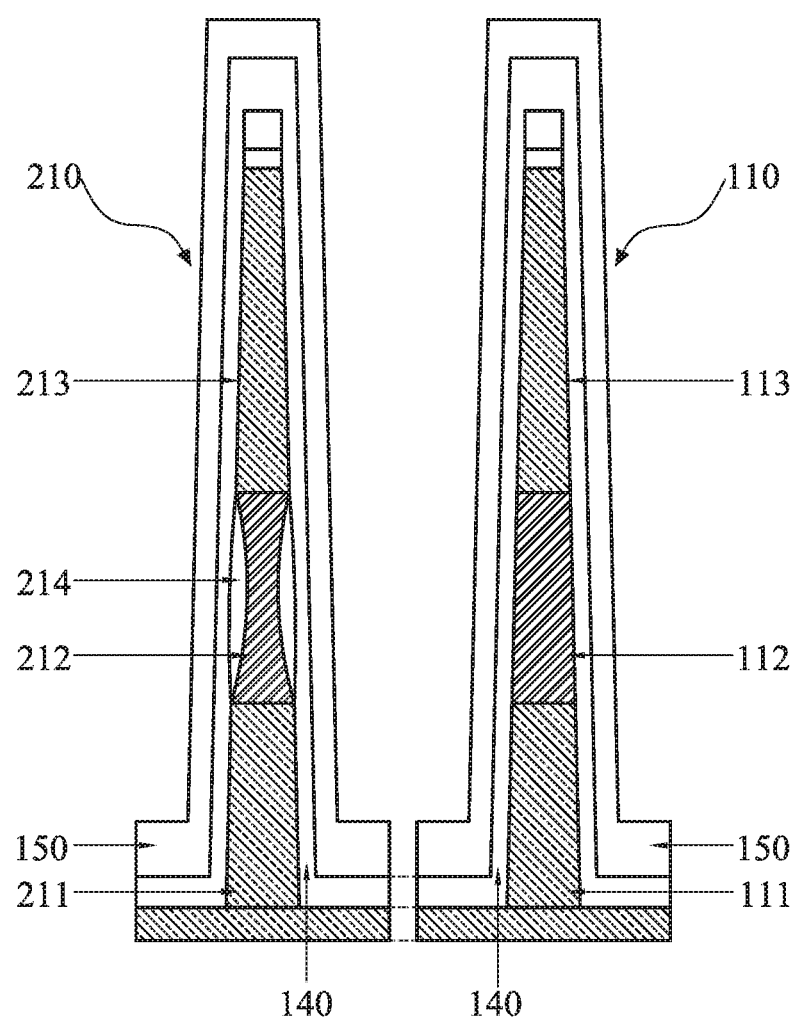

Next, as shown in FIG. 6, second protective layer 150 is formed to cover the first protective layer 140. The second protective layer 150 may include one or more layers of dielectric material that prevents an underlying layer from damage. In the present embodiment, silicon oxide ($SiO_2$) is used as the second protective layer 150. Phosphosilicate glass (PSG), SiON, SiCN, SiOCN or SiC may also be used as the second protective layer 150. The second protective layer 150 may be deposited by atomic layer deposition (ALD), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), and/or other processes. The thickness of the second protective layer 150 is in a range from about 2 nm to about 6 nm in some embodiments.

Figure 7:
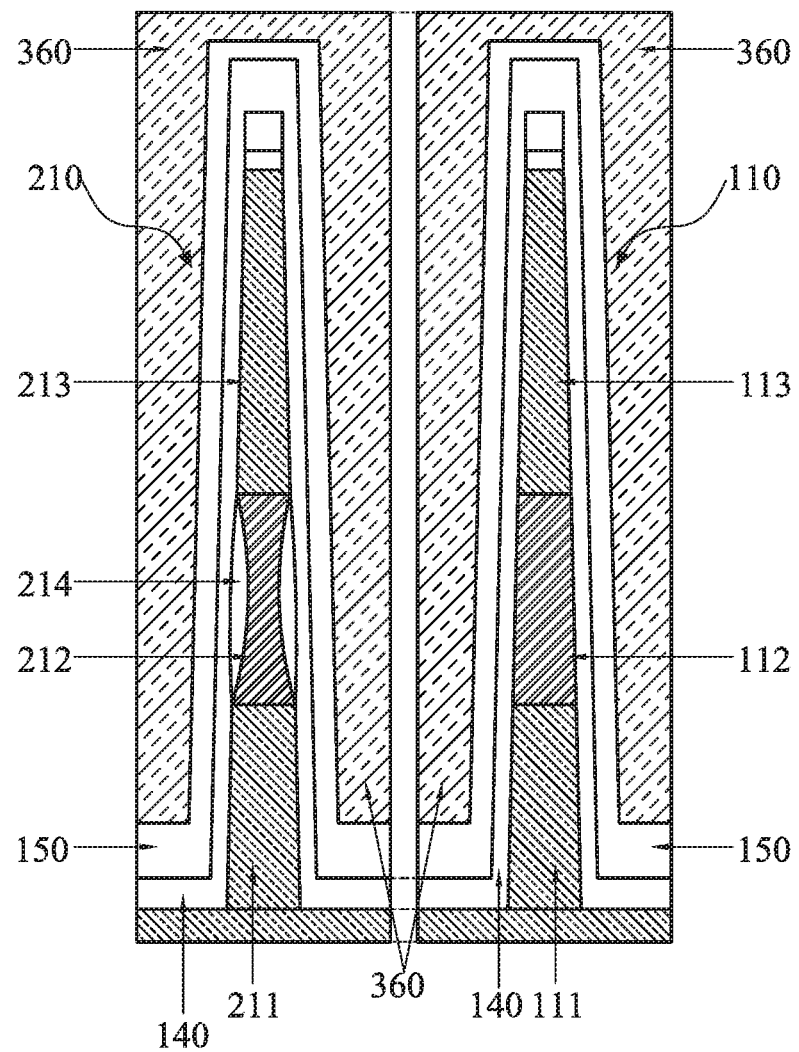

After the fin structures shown in FIG. 6 are formed, a sacrificial layer 360 is formed so that the fin structures are embedded in the sacrificial layer 360 as shown in FIG. 7. The fin structures 110 and 210 may be fully or partially embedded in the sacrificial layer 360. In this embodiment, the sacrificial layer 360 is a bottom anti-reflection coating (BARC) layer. The BARC layer may include a polymer based material. The BARC layer may be formed by spin coating. The BARC layer may be replaced with other organic materials, such as a photoresist, or a metallic material layer, such as including TiN, TaN, $TiO_2$ or $TaO_2$.

Figure 8:
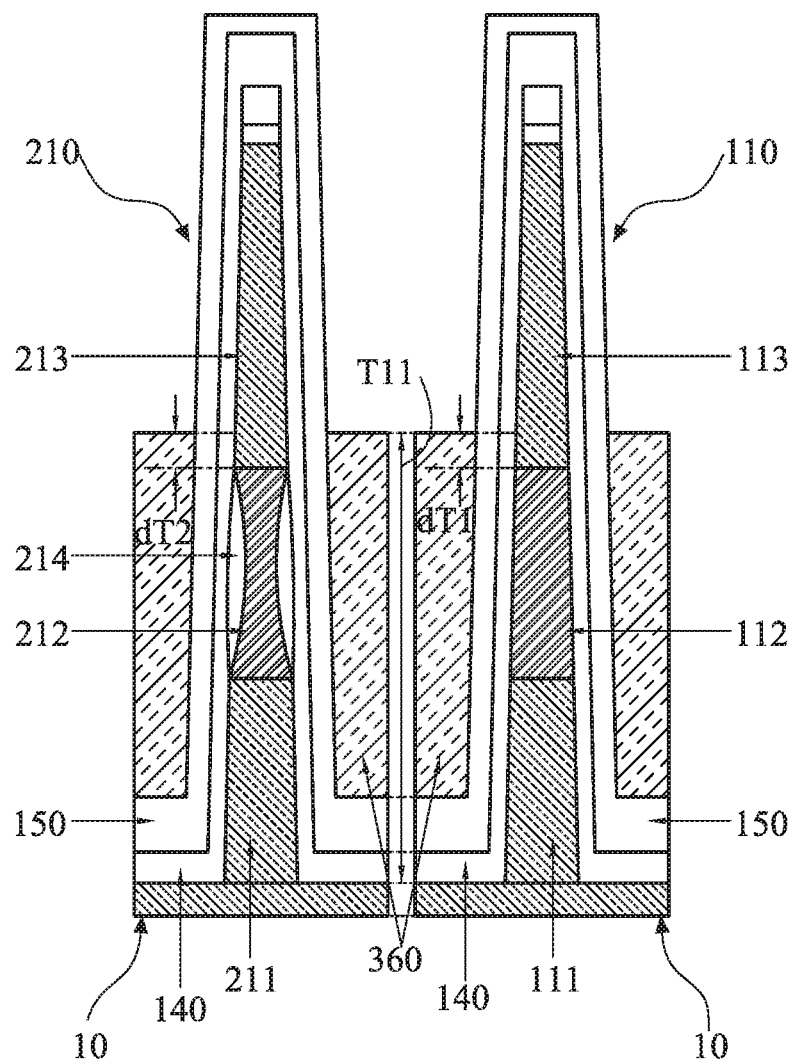

Then, as shown in FIG. 8, the thickness of the sacrificial layer 360 is reduced by, for example, an etch-back process so as to expose a part of the fin structures. The etch-back process of the BARC layer is performed by a dry etching method using a plasma of gases such as oxygen, nitrogen and other gases for example in certain embodiments. In certain embodiments, the etching time is about 50 seconds to about 90 seconds. By adjusting etching time, a desired thickness of the remaining sacrificial layer 360 can be obtained. A thickness (T11) of the remaining sacrificial layer 360 is a distance between the height of the remaining sacrificial layer 360 measured from the uppermost surface of the substrate 10. In the present disclosure, the distance (space dT1) between the height of the remaining sacrificial layer 360 and the height of the first semiconductor layer 112 is in a range from about 5 nm to about 20 nm in some embodiments. In certain embodiments, the distance dT1 is about 15-18 nm. The distance (space dT2) between the height of the remaining sacrificial layer 360 and the height of the second strain layer 212 is in a range from about 5 nm to about 20 nm in some embodiments.

Instead of etching-back the BARC layer, it may be possible to form a thin sacrificial layer of the BARC layer having the thickness T11 directly by adjusting, for example, the spin coating condition.

Figure 9:
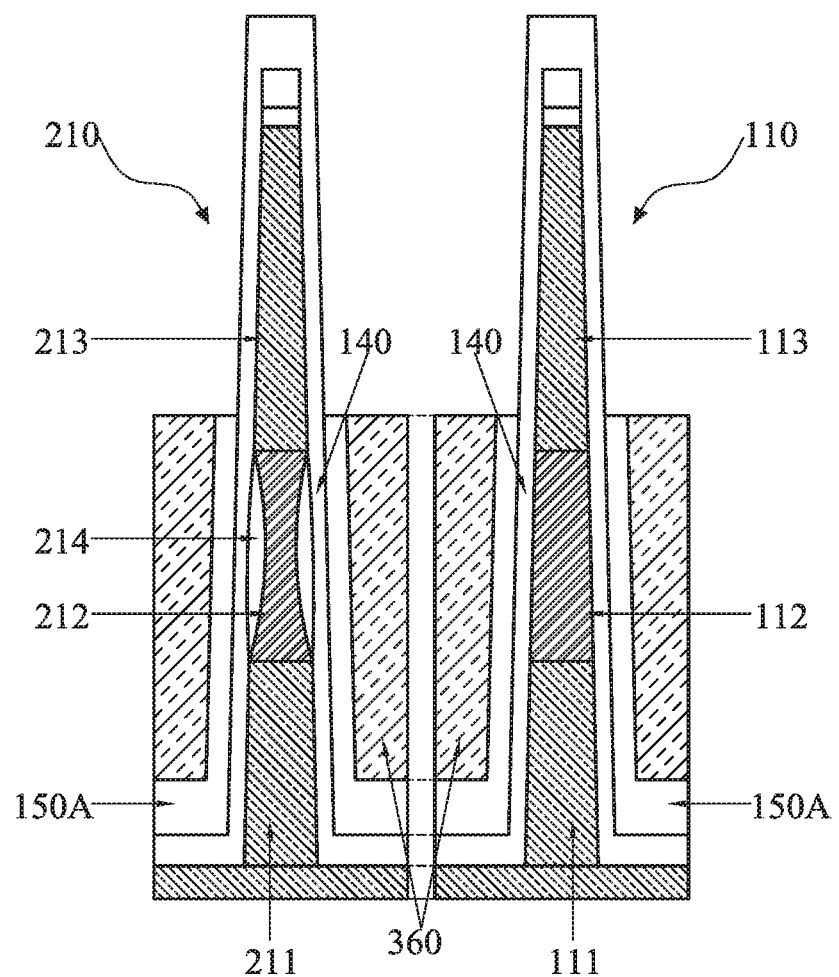
Figure 10:
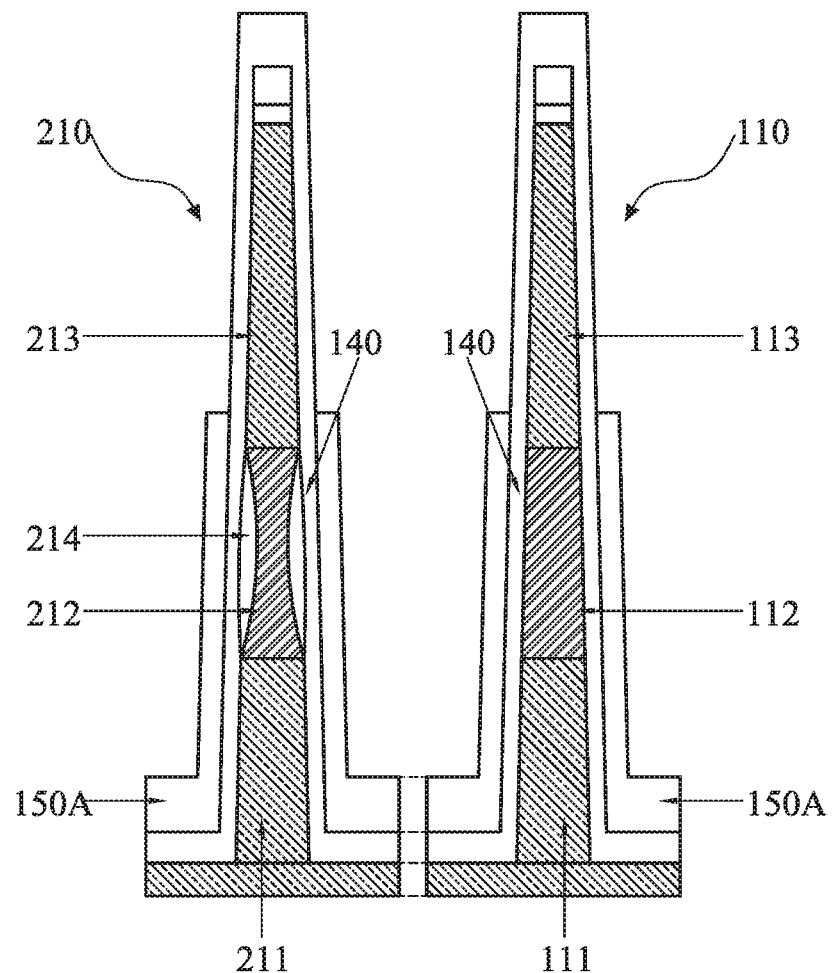

Next, as shown in FIG. 9, the upper portions of the second protective layer 150 are removed by an etching process (e.g., dry/wet etch). The second protective layer 150A is the remaining part of the second protective layer 150 after the etching process. Then, as shown in FIG. 10, the remaining sacrificial layer 360 is removed by for example, an ashing process when the sacrificial layer 360 is made of BARC layer.

Figure 11:
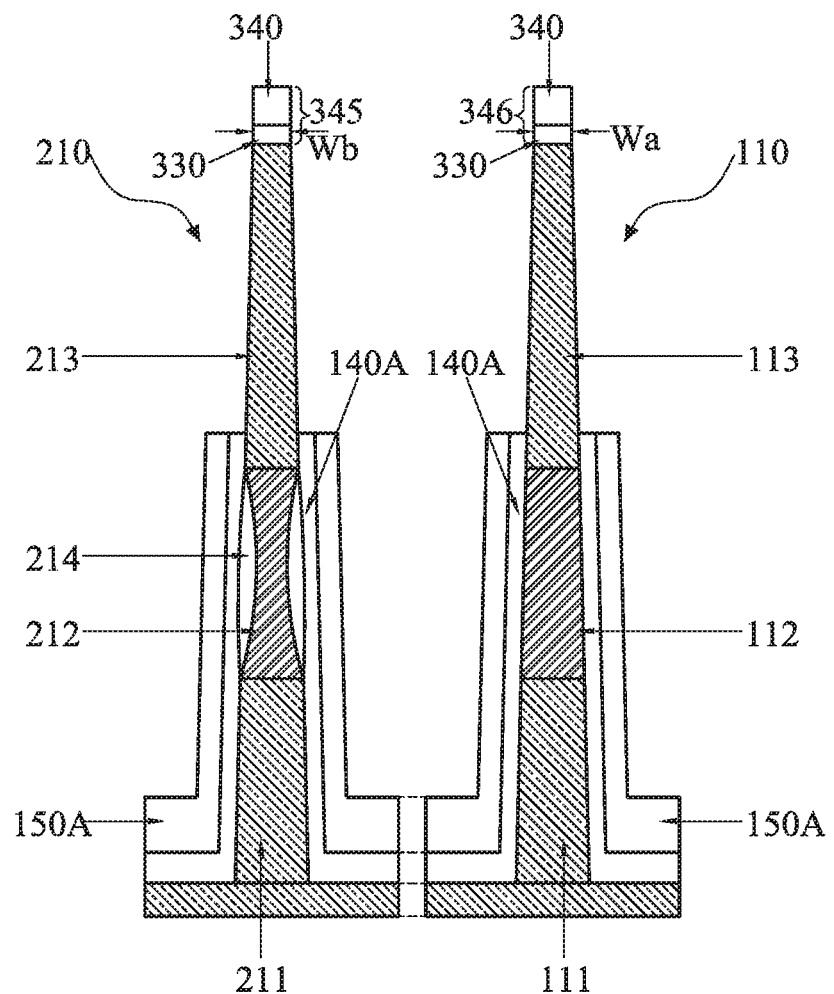

Next, as shown in FIG. 11, the upper portions of the first protective layer 140 are removed by a wet etching process, such as using phosphoric acid ($H_3PO_4$). As shown in FIG. 10, with the second protective layer 150A covering a portion of the first protective layer 140, the first protective layer 140 may be completely etched using a wet etching process, due to a high selectivity between the first protective layer 140 (e.g., silicon nitride) and the second protective layer 150A (e.g., silicon oxide) in the wet etching process using $H_3PO_4$. The first protective layer 140A is the remaining part of the first protective layer 140 after the wet etching process. In some embodiments, there is less residue of the first protective layer 140 on the Si upper layer 113, 213 by using the wet etching process compared with the case using a dry etching process. In some embodiments, the surface roughness of the Si upper layer 113, 213 not covered by the first protective layer 140A and the second protective layer 150A is improved by using the wet etching process compared with using a dry etching process.

In some embodiments, a high selectivity is achieved between the pad oxide layer 330 and the first protective layer 140 by using the wet etching process to remove upper portions of the first protective layer 140, compared with using a dry etching process. As a result, damages to the pad oxide layer 330 after removing the upper portions of the first protective layer 140 may be prevented by using the wet etching process. For example, when a dry etching process is used, undercuts may occur in the pad oxide layer 330 due to a low selectivity of the dry etching process, which reduces the width (Wb or Wa) of the pad oxide layer 330, thereby causing the silicon nitride mask layer 340 to collapse or be peeled off. In contrast, by using the wet etching, such undercuts can be prevented, thereby preventing the silicon nitride mask layer 340 from collapsing or being peeled off.

In some embodiments, the width (Wb) of the pad oxide layer 330 of the hard mask pattern 345 as shown in FIG. 11 and the width (Whb) as shown in FIG. 3 are substantially equal to each other. The width (Wa) of the pad oxide layer 330 of the hard mask pattern 346 as shown in FIG. 11 and the width (Wha) as shown in FIG. 3 may be substantially equal to each other. The width (Wb) of the pad oxide layer 330 is in a range from about 6 nm to about 18 nm in some embodiments. In certain embodiments, the width of the pad oxide layer 330 is in a range from about 8 nm to about 10 nm. The width (Wa) of the pad oxide layer 330 is in a range from about 6 nm to about 18 nm in some embodiments. In certain embodiments, the width of the pad oxide layer 330 is in a range from about 8 nm to about 10 nm.

In some embodiments, a height of the first protective layer 140A of the first fin structure 110 and a height of the second protective layer 150A of the first fin structure 110 are substantially equal to each other. In some embodiments, a height of the first protective layer 140A of the second fin structure 210 and a height of the second protective layer 150A of the second fin structure 210 are substantially equal to each other. After the removal of the part of the first protective layer 140 and the part of the second protective layer 150, a height of the first protective layer 140A of the first fin structure 110 and the height of the first protective layer 140A of the second fin structure 210 are substantially equal to each other. The differences of the height of the first protective layer 140A of the first fin structure 110 and the second fin structure 210, if any, is in the range of about 0 nm to about 3 nm in some embodiments.

Figure 12:
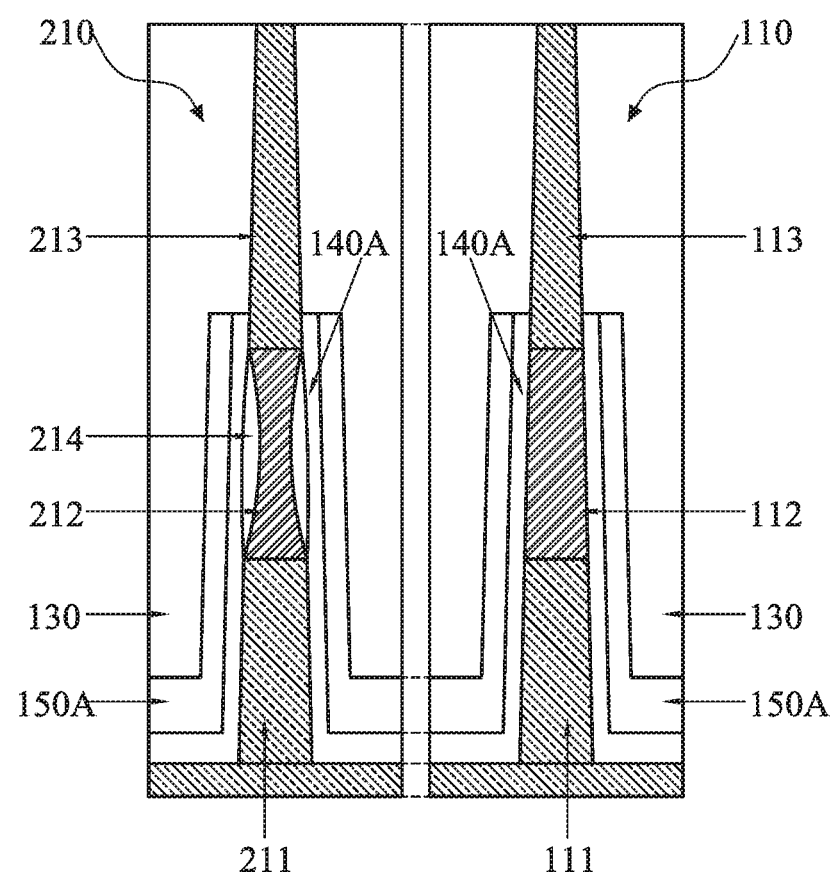

Then, as shown in FIG. 12, isolation insulating layers 130 are formed and the hard mask patterns 345 are removed. The isolation insulating layers 130 for the p-channel region and the n-channel region are substantially the same between the n-channel Fin FET and the p-channel Fin FET, and formed simultaneously. The isolation insulating layers 130 are made of, for example, one or more layers of insulating materials such as silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layers 130 is formed by one or more layers of SOG, SiO, SiON, SiOCN and/or fluoride-doped silicate glass (FSG) in some embodiments. After forming the isolation insulating layers 130, a thermal process, for example, an anneal process, is performed to improve the quality of the isolation insulating layers. Since the side walls of the first semiconductor layer 112 and the second strain layer 212 are covered by the first protective layer 140A of the first fin structure 110 and the second fin structure 210, respectively, the first semiconductor layer 112 and the second strain layer 212 are not oxidized during the thermal process for forming the isolation insulating layers 130.

Figure 13:
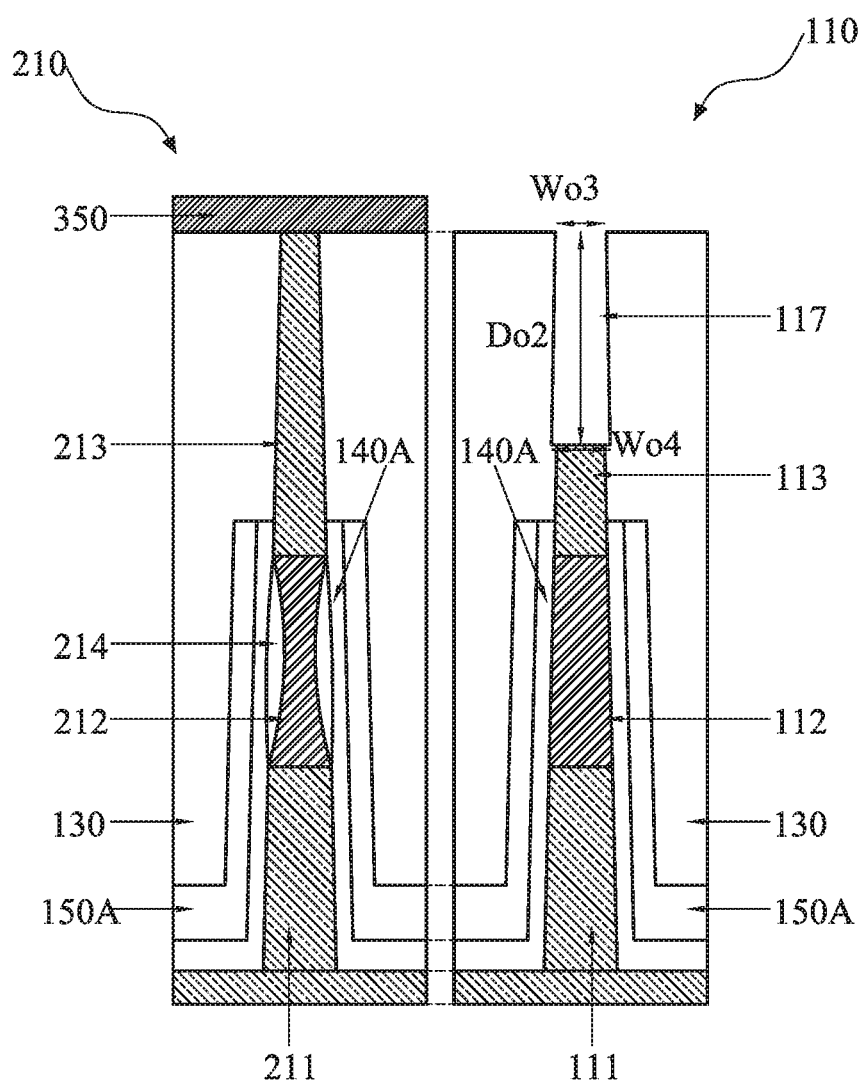

Then, a protection hard mask layer 350 is formed over the isolation insulating layers 130 in the n-channel Fin FET region as shown in FIG. 13. The protection hard mask layer 350 may include a bilayer of silicon nitride (in a range from about 10 nm to about 50 nm in some embodiments) and silicon oxide (in a range from about 5 nm to 50 nm in some embodiments), is formed over the isolation insulating layers 130 in the n-channel Fin FET region. The protection hard mask layer 350 protects the n-channel Fin FET from the subsequent processes performed on the p-channel Fin FET.

By using a patterning process, an opening 117 is formed by partially removing the isolation insulating layers 130, and the first silicon layer 113. The width Wo3 of the top of the opening 117 is in a range from about 10 nm to about 15 nm, the width Wo4 of the bottom of the opening 117 is in a range from about 10 nm to about 25 nm, and the depth Do2 of the opening 117 is in a range from about 60 nm to about 100 nm in some embodiments. In one embodiment, the width Wo4 of the bottom of the opening 117 is greater than the width Wo3 of the top of the opening 117. However, the width of the bottom of the opening 117 may be the same as or smaller than the width of the top of the opening 117. The cross sectional shape of the opening 117 may be trapezoid, reverse-trapezoid, rectangular or a barreled shape. On the bottom of the opening, an etched surface of the strain layer 113 is exposed.

Then, a SiGe layer 115 is epitaxially grown on the exposed surface of the Si layer 113 so as to fill the opening 117. Subsequently, an unnecessary SiGe layer and the protective hard mask 350 are removed by, for example, a CMP method, as shown in FIG. 14.

Figure 14:
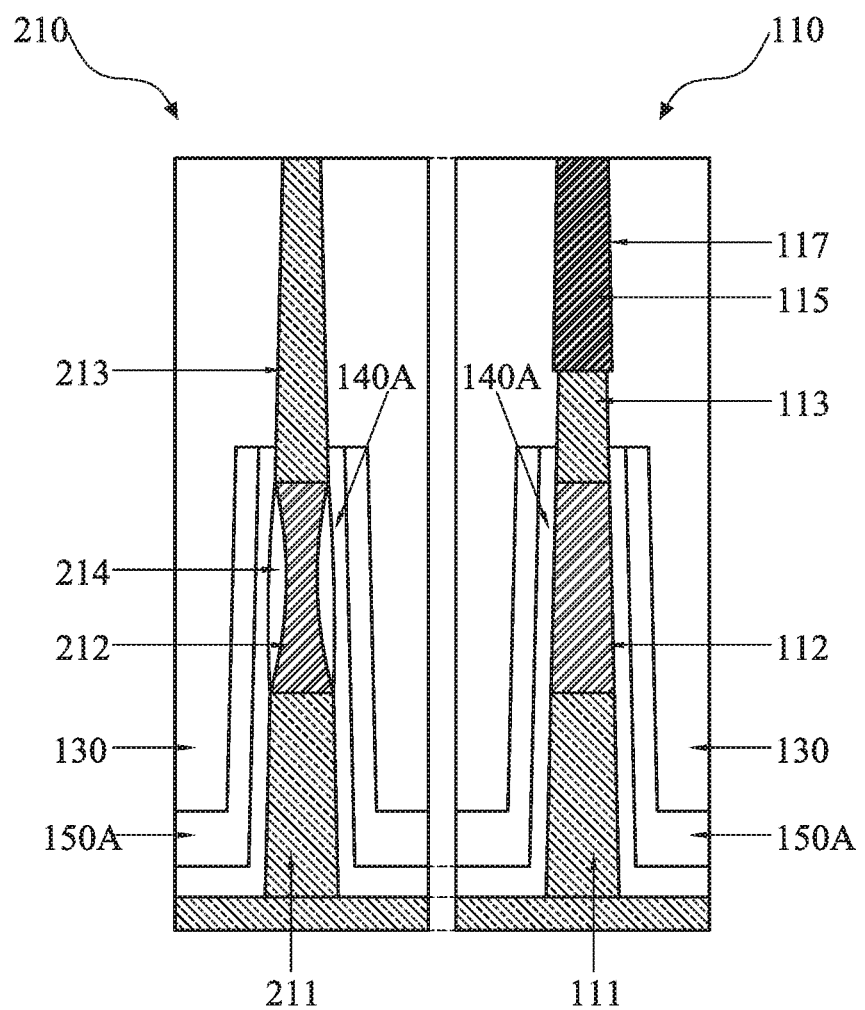

After the fin structures 110, 210 are formed as shown in FIG. 14, the gate structure as shown in FIG. 1 is formed and one or more subsequent operations may be performed associated with the gate structure.

Figure 15:
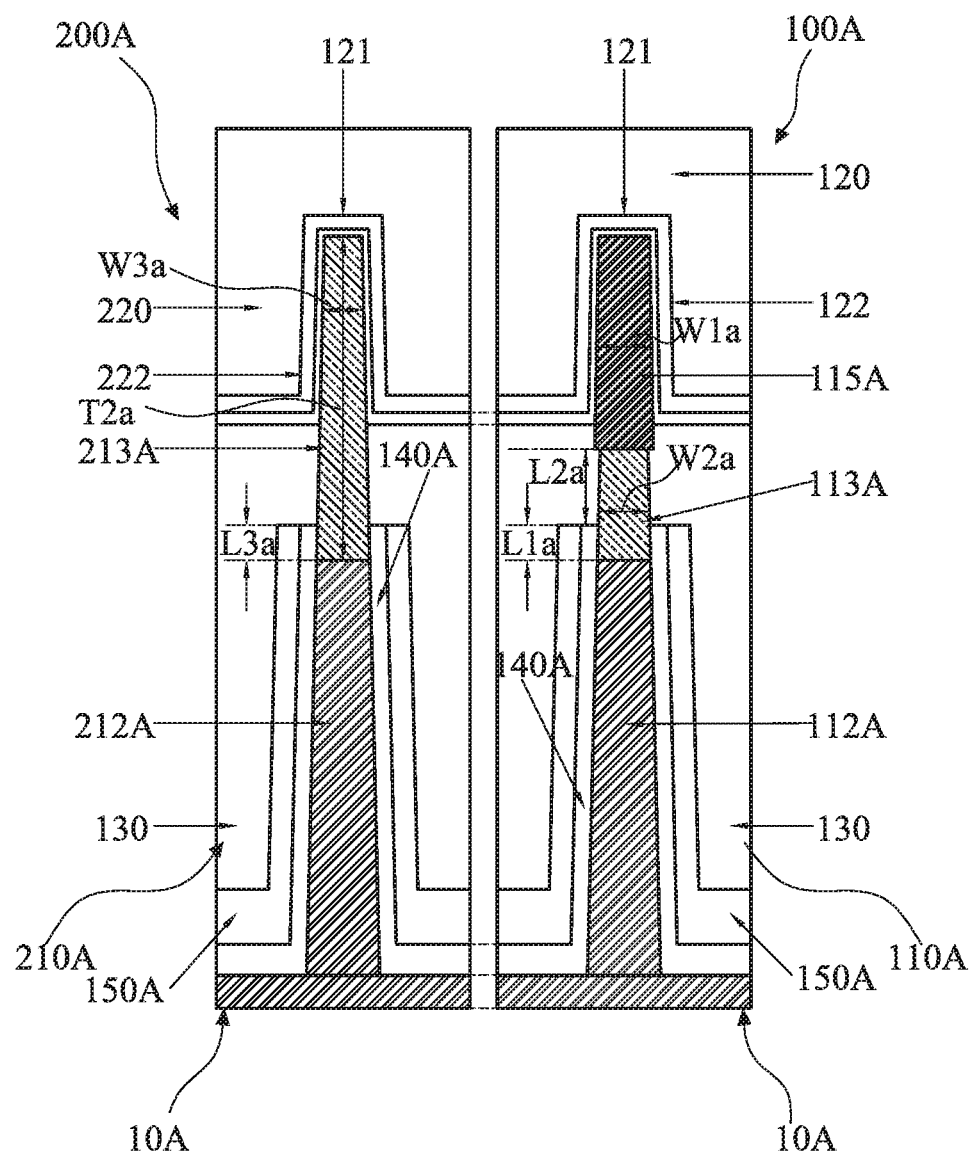
FIG. 15 is an exemplary cross sectional view of the Fin FET device according to another embodiment of the present disclosure.

FIG. 15 is an exemplary cross sectional view of the Fin FET device according to another embodiment of the present disclosure. The same materials, structures and/or configurations of FIG. 1 may be applied to FIG. 15, and the detailed explanation may be omitted. The Fin FET device includes an n-channel Fin FET 200A and a p-channel Fin FET 100A. Although the n-channel Fin FET 200A and the p-channel Fin FET 100A are separately illustrated in the drawings, the n-channel Fin FET 200A and the p-channel Fin FET 100A are disposed in the same semiconductor device, and some layers are continuously formed in a p-channel Fin FET region and an n-channel Fin FET region.

A first fin structure 110A of the p-channel Fin FET 100 includes a first base layer 112A protruding from a substrate 10A, a first semiconductor layer 113A is disposed over the first base layer 112A and a first channel layer 115A (p-channel layer) is disposed over the first semiconductor layer 113A. In this embodiment, the substrate 10A is a SiGe substrate. Alternatively, the substrate 10A may comprise another elementary semiconductor, such as germanium; III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. The substrate 10A may include various regions that have been suitably doped (e.g., p-type or n-type conductivity).

The first base layer 112A may be made of the same material as the substrate 10A and may continuously extend from the substrate 10A. In some embodiments, the first semiconductor layer 113A is a Si layer. The first semiconductor layer 113A is an epitaxial grown layer on the first base layer 112A. The width W2a of the first semiconductor layer 113A is in a range from about 10 nm to about 20 nm in some embodiments.

The first channel layer 115A is made of Ge or a Ge compound such as doped or un-doped SiGe in some embodiments. Because of the hetero structure of the Si layer 113A and the SiGe channel layer 115A, a compressive stress is applied to a channel of the p-channel Fin FET. The average width of the channel layer 115A is greater than the average width of the first semiconductor layer 113A in some embodiments. At the interface between the first semiconductor layer 113A and the channel layer 115A, the width of the channel layer 115A is greater than the width of the first semiconductor layer 113A. In some embodiments, the average width of the channel layer 115A is equal to or smaller than the average width of the first semiconductor layer 113A.

A second fin structure 210A of the n-channel Fin FET 200A includes a second base layer 212A protruding from the substrate 10A and a second channel layer 213A (n-channel layer) disposed over the second base layer 212A. The second base layer 212A may be made of the same material as the substrate 10A and may continuously extend from the substrate 10A. The second channel layer 213A is made of Si layer in some embodiments. The width W3a of the channel layer 213A is in a range from about 10 nm to about 15 nm in some embodiments. Because of the hetero structure of the second base layer 212A and the Si channel layer 213A, a tensile stress is applied to a channel of the n-channel Fin FET. The thickness T2a of the second channel layer 213A is in a range from about 40 nm to about 60 nm in some embodiments.

As shown in FIG. 15, the second protective layer 150A for the p-channel Fin FET covers the side walls of 112A, but covers only a part of the side walls of the first semiconductor layer 113A. The second protective layer 150A covers the side walls of the first protective layer 140A. As a result, the first protective layer 140A and second protective layer 150A are spaced apart from the first channel layer 115A. The height of the first protective layer 140A is substantially equal to the height of the first protective layer 150A.

The distance (length L1a) that the first protective layer 140A covers the part of the side walls of the first semiconductor layer 113A is in a range from about 5 nm to about 20 nm to effectively protect the SiGe layer in some embodiments. The distance (space L2a) between the first protective layer 140A and the first channel layer 115A is in a range from about 15 nm to about 30 nm in some embodiments.

Similarly, in the n-channel Fin FET 200A, the second protective layer 150A covers only the bottom portion of the second channel layer 213A by a distance (length L3a) in a range from about 5 nm to about 20 nm in some embodiments. The second protective layer 150A covers the side walls of the first protective layer 140A. The height of the first protective layer 140A is substantially equal to the height of the second protective layer 150A. In this embodiment, the first protective layer 140A for the n-channel Fin FET 200A and the p-channel Fin FET 100A is formed at the same time by the same film forming operation. However, the first protective layer may be separately formed for each of the n-channel Fin FET 200A and the p-channel Fin FET 100A. Similarly, the second protective lay 150A may be separately formed for each of the n-channel Fin FET 200A and the p-channel Fin FET 100A.

In this embodiment, the height of the first protective layer 140A of the first fin structure 110A is substantially equal to the height of the first protective layer 140A the second fin structure 210A. Here, "substantially equal" means that a difference is less than 2-3 nm. When the depths of the fin structures are not uniform, the height from the substrate may be measured from the plane that corresponds to the average depths of the fin structures.

In the present disclosure, the shape of the fin structure in the cross section is a tapered shape (e.g., trapezoid). However, the shape is not limited to trapezoid. In some embodiments, the shape of the fin structure in the cross section is reverse trapezoid, rectangular, mesa, or mixture thereof. A part of the fin structure (e.g., base layer, intermediate layer, strain layer and/or channel layer) may be tapered and/or rectangular. Further, the corners of the fin structures, for example the corners of channel layers, may be rounded.

Each layer of the fin structures is doped with appropriate impurities. For p-channel Fin FET 100A, the first channel layer 115A is doped with boron (B) or $BF_2$, and for n-channel Fin FET 200A, the second channel layer 213A is doped with arsenic and/or phosphorous.

The first fin structure 110A of the p-channel Fin FET 100A and the second fin structure 210A of the n-channel Fin FET 200A are electrically isolated from each other and from adjacent devices by isolation insulating layers 130, respectively. This isolation is called an STI (shallow trench isolation). The isolation insulating layers 130 includes one or more layers of insulating material, such as silicon dioxide formed by, for example, a flowable chemical vapor deposition (CVD) in some embodiments.

The p-channel Fin FET 100A further includes a gate dielectric layer 121 and a first gate electrode 120 disposed over the first channel layer 115A. A width W1a of the first channel layer 115A covered by the gate electrode 120 is in a range from about 15 nm to about 25 nm in some embodiments. The n-channel Fin FET 200A also includes the gate dielectric layer 121 and a second gate electrode 220 disposed over the second channel layer 213A. A width W3a of the second channel (n-channel) layer 213A covered by the gate electrode 220 is in a range from about 10 nm to about 15 nm in some embodiments. The material of the gate dielectric layer for the p-channel FET and n-channel FET are different in some embodiments. In certain embodiments of the present disclosure, work function adjustment layers 122 and 222 are interposed between the gate dielectric layers 121 and the gate electrodes 120, 220. The material may be used for the gate dielectric layer 121, the gate electrodes 120 and 220, and the work function adjustment layers 122 and 222 are described with reference to FIG. 1.

FIGS. 16-26 show cross sectional views of exemplary sequential process of manufacturing the Fin FET device according to another embodiment of the present disclosure.

It is understood that additional operations can be provided before, during, and after processes shown by FIGS. 16-26, and some of the operations described below can be replaced or eliminated, for additional embodiments of the method. The order of the operations/processes may be interchangeable. The same materials, operations and/or configurations of FIGS. 2-14 may be applied to FIGS. 16-26, and the detailed explanation may be omitted.

Figure 16:
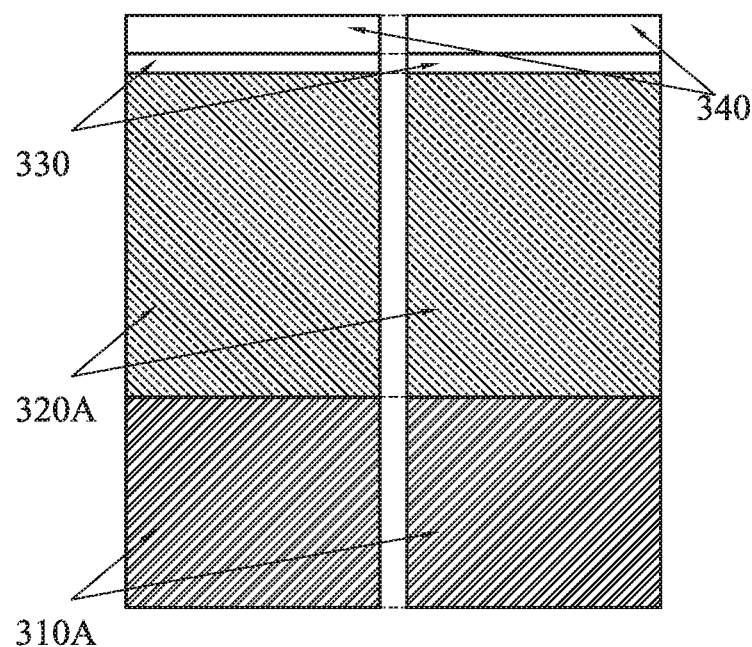
FIGS. 16-27 show exemplary processes for manufacturing the Fin FET device according to another embodiment of the present disclosure.

As shown in FIG. 16, a stacked layer of a base layer 310A and an upper semiconductor layer 320A is provided. In one embodiment, the base layer 310A may include Ge or a Ge compound such as doped or un-doped SiGe and the upper semiconductor layer 320A is silicon. The Si upper layer 320A is an epitaxial grown layer and has a thickness in a range from about 40 nm to about 60 nm in some embodiments.

As shown in FIG. 16, a mask layer is further formed over the upper semiconductor layer 320A. The mask layer includes, for example, a pad oxide (e.g., silicon oxide) layer 330 and a silicon nitride mask layer 340 in some embodiments. The thickness of the pad oxide layer 330 is in a range from about 2 nm to about 15 nm and the thickness of the silicon nitride mask layer 340 is in a range from about 10 nm to about 50 nm in some embodiments.

Figure 17:
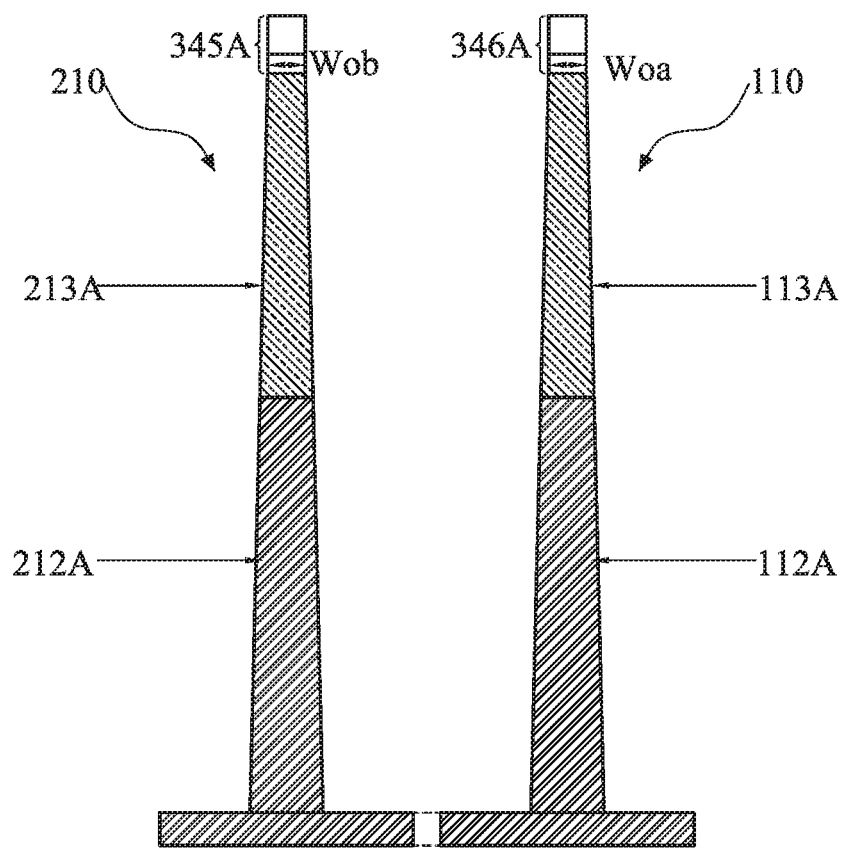

By using a patterning process, hard mask patterns 345A and 346A of the pad oxide layer 330 and the silicon nitride mask layer 340 are formed, as shown in FIG. 17. The width (length Wob) of the hard mask pattern 345A is in a range from about 6 nm to about 18 nm in some embodiments. In certain embodiments, the width Wob of the hard mask pattern 345A is in a range from about 8 nm to about 10 nm. The width (length Woa) of the hard mask pattern 346A is in a range from about 6 nm to about 18 nm in some embodiments. In certain embodiments, the width Woa of the hard mask pattern 346A is in a range from about 8 nm to about 10 nm.

As shown in FIG. 17, by using the hard mask patterns 345A and 346A as etching masks, the SiGe base layer 310A and the Si upper layer 320A are pattered into fin structures 110A, 210A by trench etching using a dry etching method and/or a wet etching method.

Figure 18:
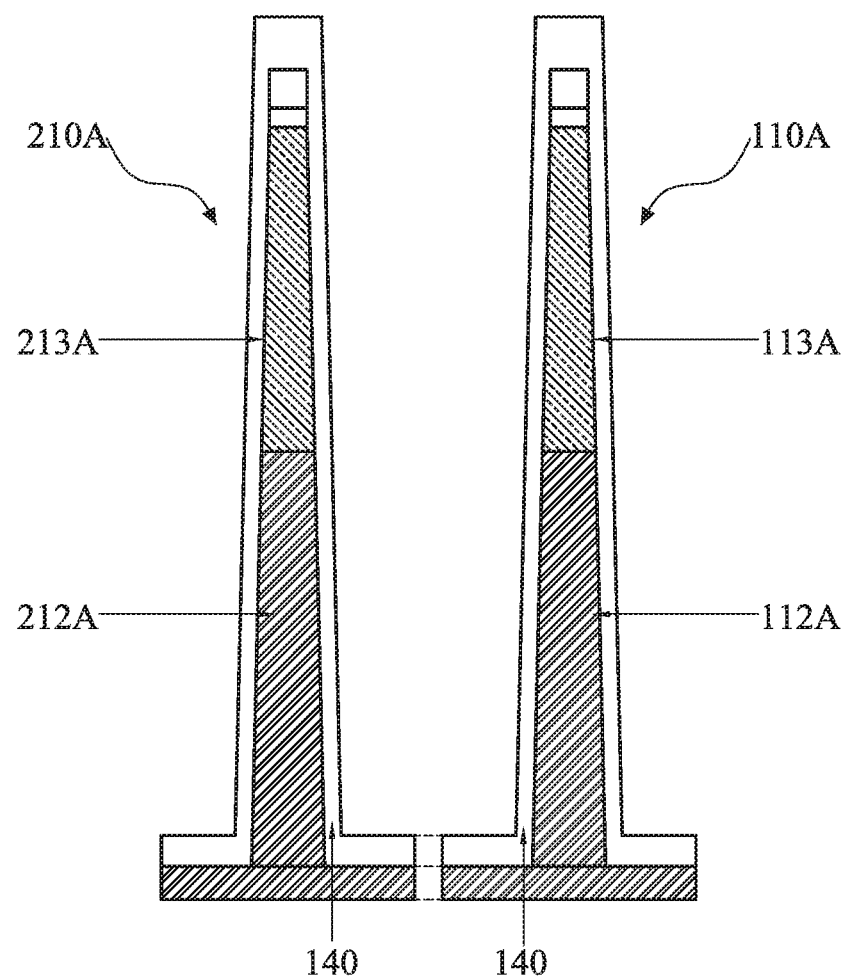

As shown in FIG. 18, first protective layer 140 is formed to cover the first fin structure 110A and the second fin structure 210A, respectively. The first protective layer 140 may include one or more layers of dielectric material that prevents an underlying layer from oxidizing. In the present embodiment, silicon nitride (SiN) is used as the protective layers. SiON, SiCN, SiOCN or SiC may also be used as the protective layer. The SiN layer may be deposited by physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer deposition (ALD), and/or other processes. In a LPCVD or plasma CVD process, a silicon source such as $Si_2H_6$, $SiH_4$ and/or $Si_2Cl_6$ and a nitrogen source such as $NH_3$ and/or $N_2$ are used and the SiN film is formed at a temperature in a range from about a room temperature to about 1000° C. under a reduced pressure in a range from about 0.01 to 10 Torr (about 1.33 Pa to about 1333 Pa) in some embodiments. The thickness of the first protective layers 140 is in a range from about 2 nm to about 6 nm in some embodiments.

The first protective layer 140 protects the first base layer 112A and the second base layer 212A from the subsequent processes, e.g., an STI formation. As long as the side walls of the first base layer 112A and the second base layer 212A are fully covered by the first protective layer 140, the first protective layer 140 do not necessarily cover the entire side walls of the Si upper layers 113A, 213A. In other words, the first protective layer 140 may partially cover the side walls of the Si upper layers 113A, 213A.

Figure 19:
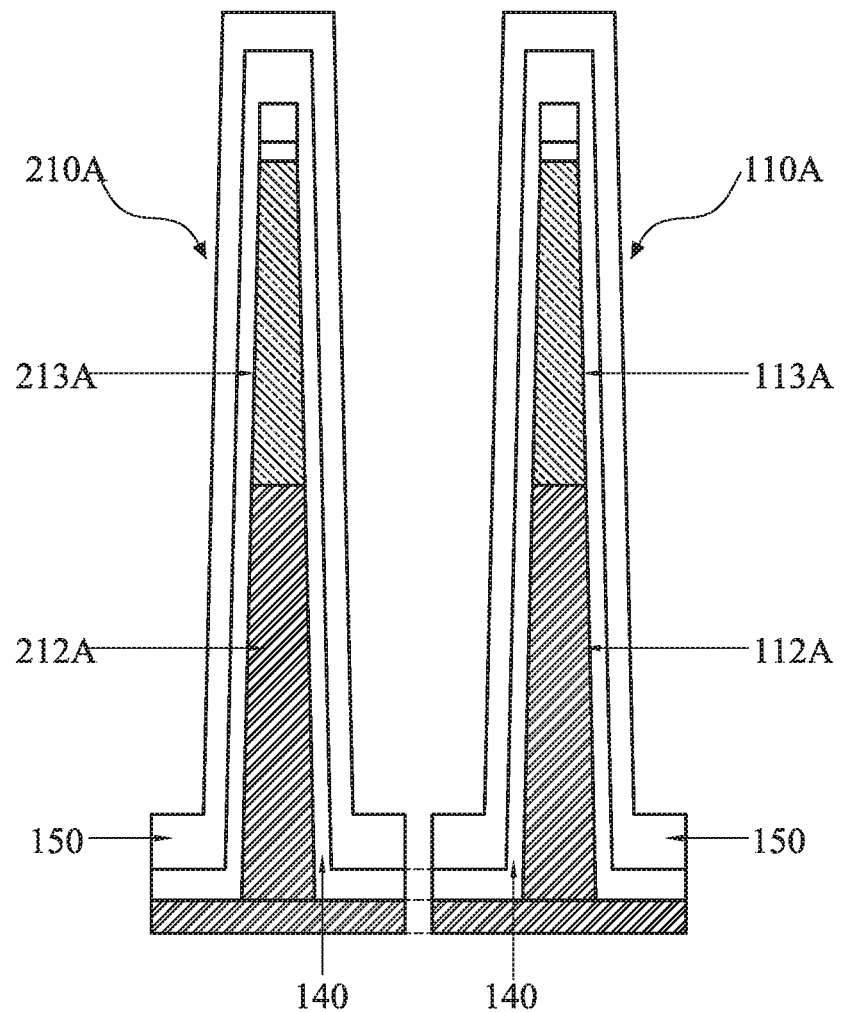

Next, as shown in FIG. 19, second protective layer 150 is formed to cover the first protective layers 140. The second protective layers 150 may include one or more layers of dielectric material that prevents an underlying layer from damage. In the present embodiment, silicon oxide ($SiO_2$) is used as the second protective layer 150. Phosphosilicate glass (PSG), SiON, SiCN, SiOCN or SiC may also be used as the second protective layer 150. The second protective layer 150 may be deposited by atomic layer deposition (ALD), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), and/or other processes. The thickness of the second protective layer 150 is in a range from about 2 nm to about 6 nm in some embodiments.

Figure 20:
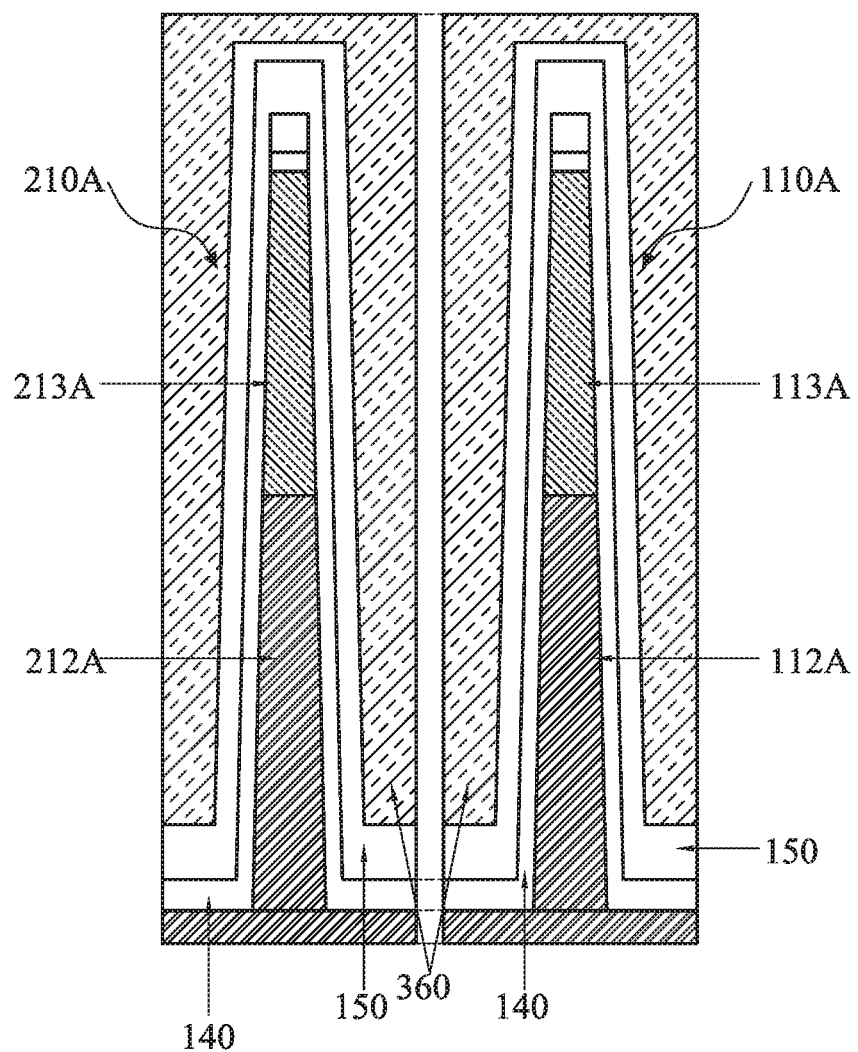

After the fin structures shown in FIG. 19 are formed, a sacrificial layer 360 is formed so that the fin structures are embedded in the sacrificial layer 360 as shown in FIG. 20. The fin structures 110A and 210A may be fully or partially embedded in the sacrificial layer 360. In this embodiment, the sacrificial layer is a bottom anti-reflection coating (BARC) layer. The BARC layer may include a polymer based material. The BARC layer may be formed by spin coating. The BARC layer may be replaced with other organic materials, such as a photoresist, or a metal compound 1 layer, such as TiN, TaN, $TiO_2$ or $TaO_2$.

Figure 21:
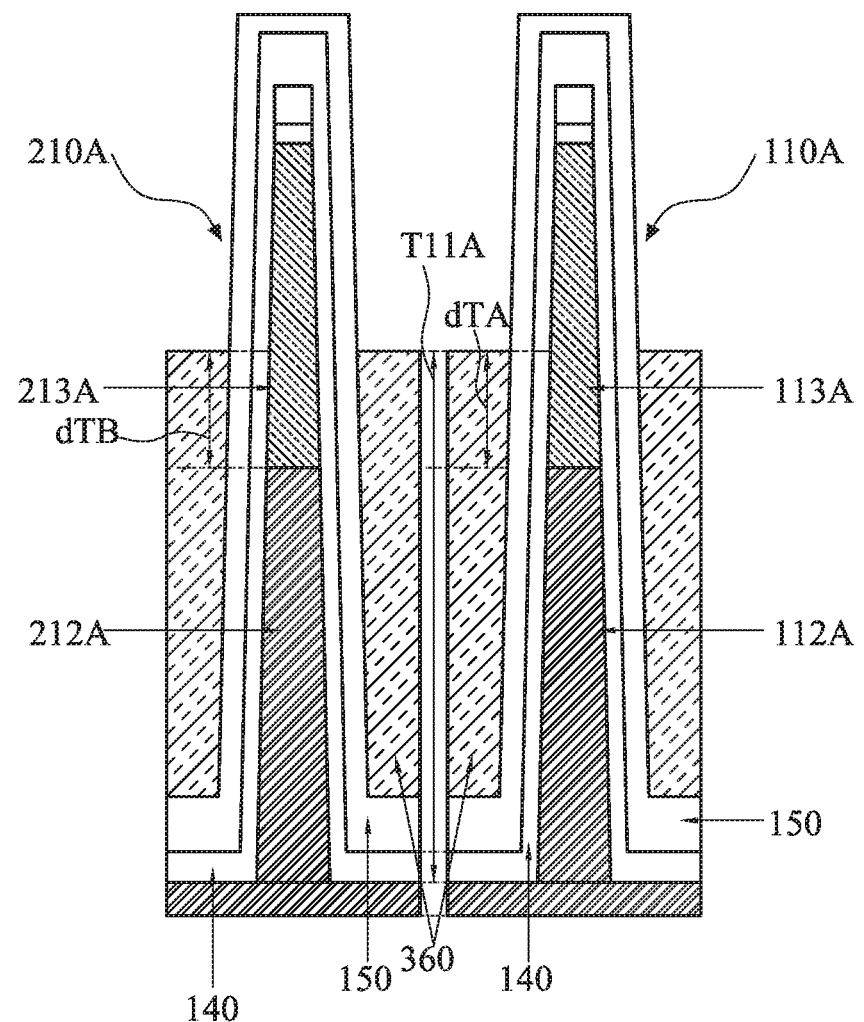

Then, as shown in FIG. 21, the thickness of the sacrificial layer 360 is reduced by, for example, an etch-back process so as to expose a part of the fin structures. The etch-back process of the BARC layer is performed by a dry etching method using oxygen, nitrogen and/or other gases for example in certain embodiments. In certain embodiments, the etching time is about 50 seconds to about 90 seconds. By adjusting etching time, a desired thickness of the remaining sacrificial layer 360 can be obtained. A thickness (T11A) of the remaining sacrificial layer 360 is a distance between the height of the remaining sacrificial layer 360 measured from the uppermost surface of the substrate 10. In the present disclosure, the distance (space dTB) between the height of the remaining sacrificial layer 360 and the height of the second base layer 212A is in a range from about 5 nm to about 20 nm in some embodiments. The distance (space dTA) between the height of the remaining sacrificial layer 360 and the height of the first base layer 112A is in a range from about 5 nm to about 20 nm in some embodiments.

Figure 22:
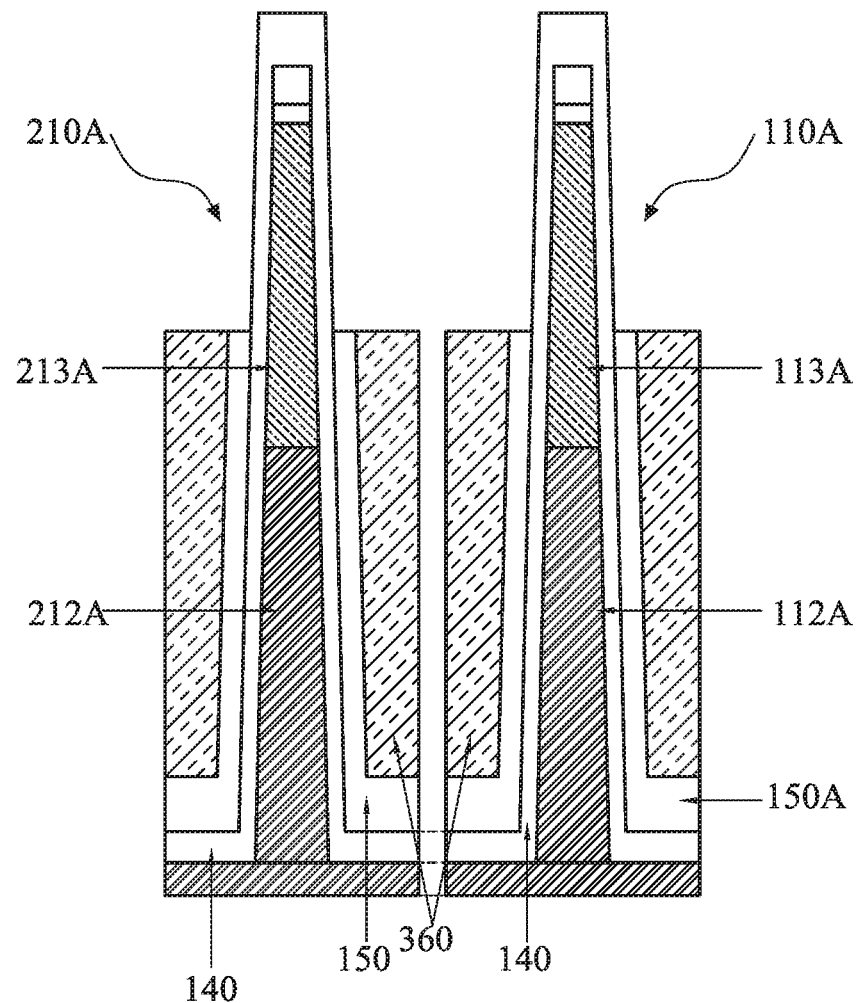
Figure 23:
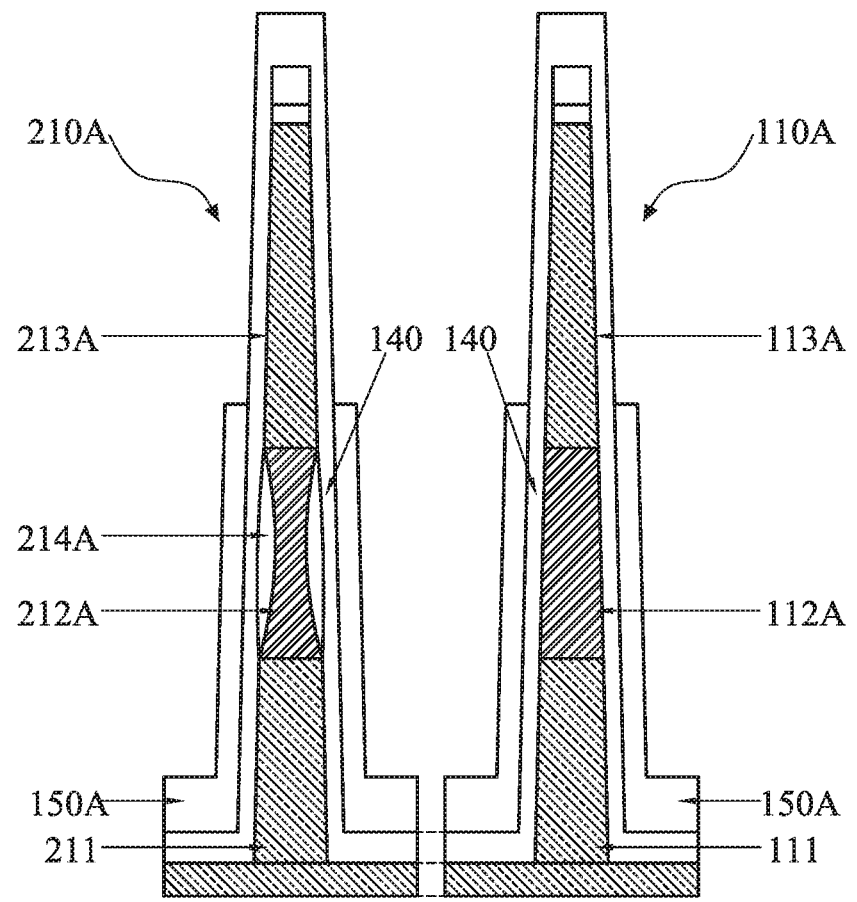
Figure 24:
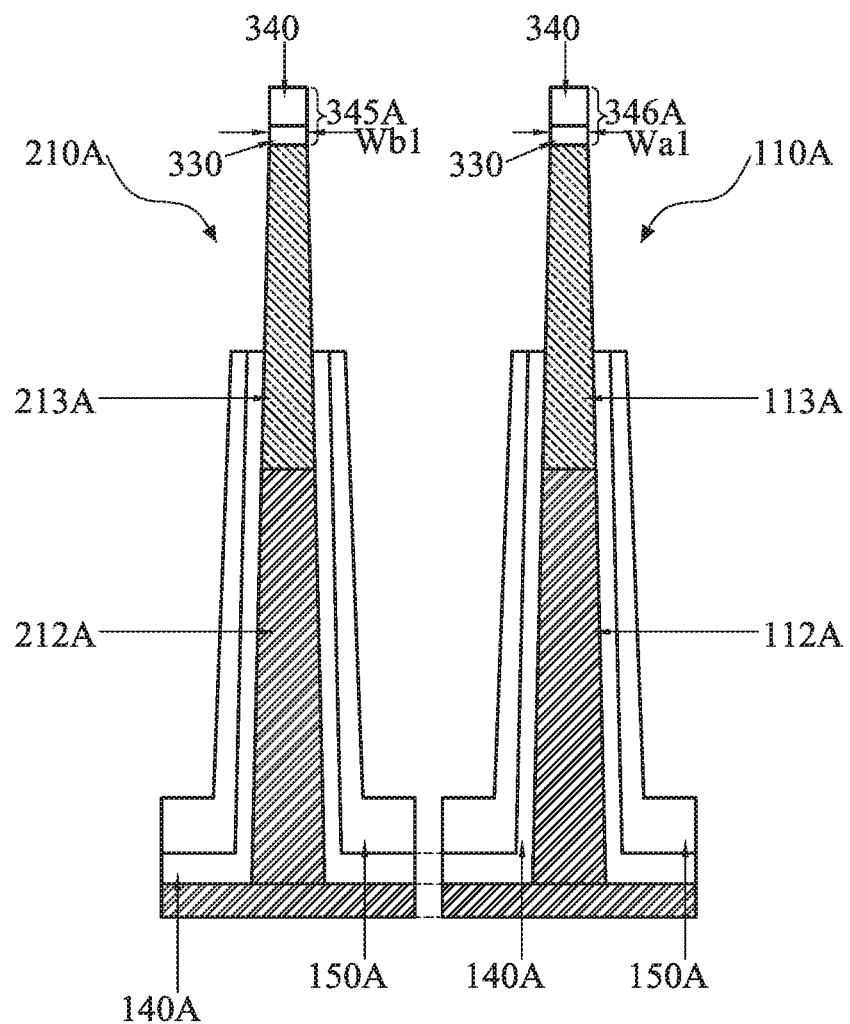

Next, as shown in FIG. 22, the upper portions of the second protective layer 150 are removed by an etching process (e.g., dry/wet etch). Then, as shown in FIG. 23, the remaining sacrificial layer 360 is removed by for example, an ashing process when the sacrificial layer 360 is made of BARC layer. Next, as shown in FIG. 24, the upper portions of the first protective layers 140 are removed by a wet etching process, such as using phosphoric acid ($H_3PO_4$). As shown in FIG. 23, with the second protective layer 150A covering a portion of the first protective layer 140, the first protective layer 140 may be completely etched using a wet etching process, due to a high selectivity between the first protective layer 140 (e.g., silicon nitride) and the second protective layer 150A (e.g., silicon oxide) in the wet etching process using $H_3PO_4$. The first protective layer 140A is the remaining part of the first protective layer 140 after the wet etching process. In some embodiments, there is less residue of the first protective layer 140 on the Si upper layer 113A, 213A by using the wet etching process compared with using a dry etching process. In some embodiments, the surface roughness of the Si upper layer 113A, 213A not covered by the first protective layer 140A and the second protective layer 150A is improved by using the wet etching process compared with using a dry etching process.

In this embodiment, a high selectivity may be achieved between the pad oxide layer 330 and the first protective layer 140 by using the wet etching process to remove upper portions of the first protective layer 140, compared with using a dry etching process. As a result, damages to the pad oxide layer 330 after removing the upper portions of the first protective layer 140 may be prevented by using the wet etching process. For example, one or more undercuts may be prevented to reduce to the width (Wb1 or Wa1) of the pad oxide layer 330 due to a low selectivity between the pad oxide layer 330 and the silicon nitride mask layer 340 using a dry etching process, thereby causing the silicon nitride mask layer 340 to collapse or peel.

In some embodiments, the width (Wb1) of the pad oxide layer 330 of the hard mask pattern 345A as shown in FIG. 24 and the width (Wob) as shown in FIG. 17 are substantially equal to each other. The width (Wa1) of the pad oxide layer 330 of the hard mask pattern 346A as shown in FIG. 24 and the width (Woa) as shown in FIG. 17 may be substantially equal to each other. The width (Wb1) of the pad oxide layer 330 is in a range from about 6 nm to about 18 nm in some embodiments. In certain embodiments, the width of the pad oxide layer 330 is in a range from about 8 nm to about 10 nm. The width (Wa1) of the pad oxide layer 330 is in a range from about 6 nm to about 18 nm in some embodiments. In certain embodiments, the width of the pad oxide layer 330 is in a range from about 8 nm to about 10 nm.

In some embodiments, a height of the first protective layer 140A of the first fin structure 110A and a height of the second protective layer 150A of the first fin structure 110A are substantially equal to each other. In some embodiments, a height of the first protective layer 140A of the second fin structure 210A and a height of the second protective layer 150A of the second fin structure 210A are substantially equal to each other. After the removal of the part of the first protective layer 140 and the part of the second protective layer 150, a height of the first protective layer 140A of the first fin structure 110A and the height of the first protective layer 140A of the second fin structure 210A are substantially equal to each other. The differences of the height of the first protective layer 140A of the first fin structure 110A and the second fin structure 210A, if any, is in the range of about 0 nm to about 3 nm in some embodiments.

Figure 25:
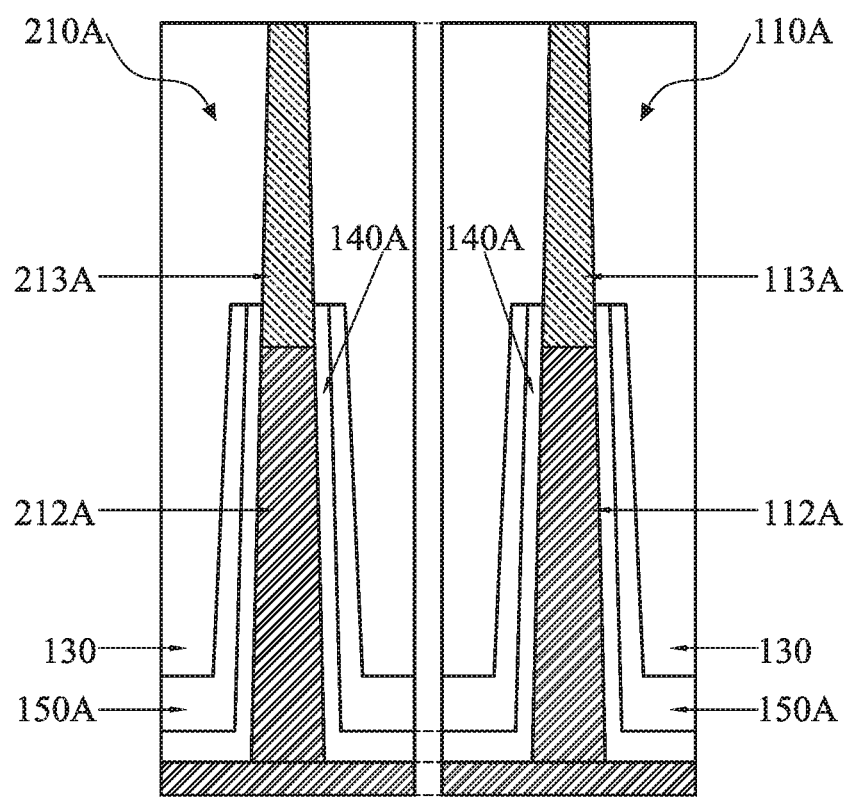

Then, as shown in FIG. 25, isolation insulating layers 130 are formed and the hard mask patterns 345 are removed. The isolation insulating layers 130 for the p-channel region and the n-channel region are substantially the same between the n-channel Fin FET and the p-channel Fin FET, and formed at the same time. The isolation insulating layers 130 are made of, for example, one or more layers of insulating materials such as silicon dioxide formed by LPCVD (low pressure chemical vapor deposition), plasma-CVD or flowable CVD. In the flowable CVD, flowable dielectric materials instead of silicon oxide are deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ a perhydrosilazane (TCPS), a perhydro-polysilazane (PSZ), a tetraethyl orthosilicate (TEOS), or a silylamine, such as trisilylamine (TSA). These flowable silicon oxide materials are formed in a multiple-operation process. After the flowable film is deposited, it is cured and then annealed to remove un-desired element(s) to form silicon oxide. When the un-desired element(s) is removed, the flowable film densifies and shrinks. In some embodiments, multiple anneal processes are conducted. The flowable film is cured and annealed more than once. The flowable film may be doped with boron and/or phosphorous. The isolation insulating layers 130 is formed by one or more layers of SOG, SiO, SiON, SiOCN and/or fluoride-doped silicate glass (FSG) in some embodiments.

After forming the isolation insulating layers 130, a thermal process, for example, an anneal process, is performed to improve the quality of the isolation insulating layers. Since the side walls of the first base layer 112A and the second base layer 212A are covered by the first protective layer 140A, respectively, the first base layer 112A and the second base layer 212A are not oxidized during the thermal process for forming the isolation insulating layers 130.

Figure 26:
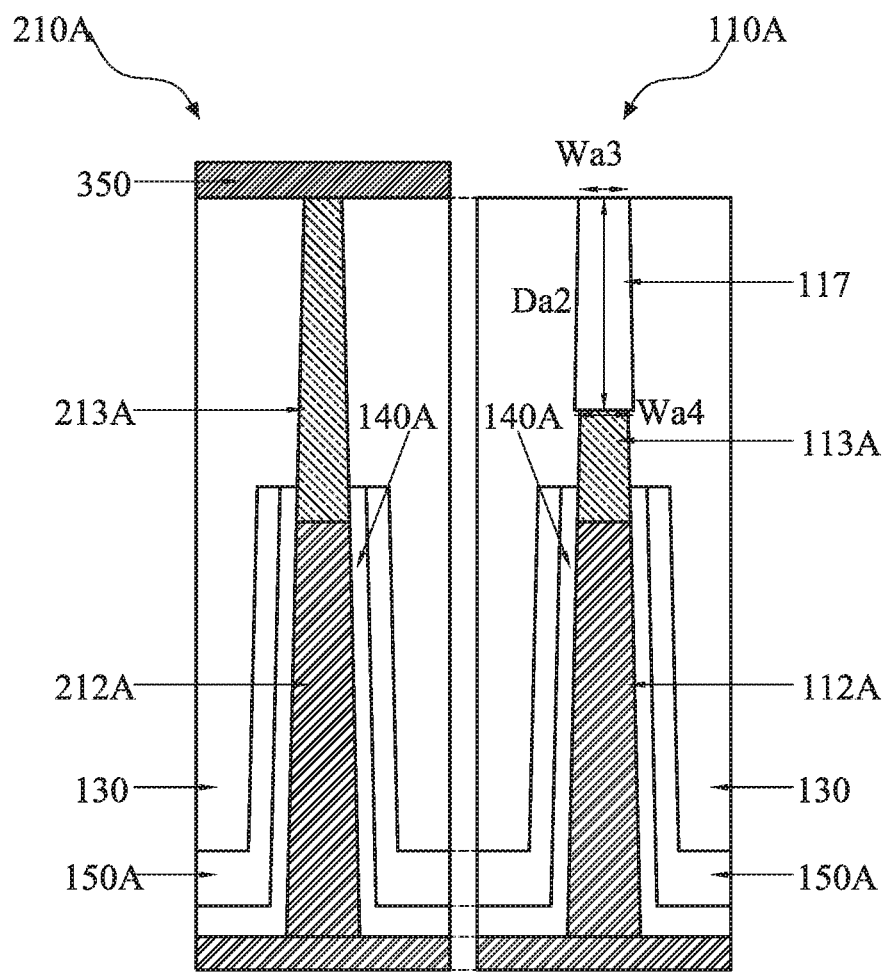

Then, a protection hard mask layer 350 is formed over the isolation insulating layer 130 in the n-channel Fin FET region as shown in FIG. 26. The protection hard mask layer 350 includes a bilayer of silicon nitride (in a range from about 10 nm to about 50 nm in some embodiments) and silicon oxide (in a range from about 5 nm to 50 nm in some embodiments), is formed over the isolation insulating layer 130 in the n-channel Fin FET region. The protection hard mask layer 350 protects the n-channel Fin FET from the subsequent processes performed on the p-channel Fin FET.

By using a patterning process, an opening 117 is formed by partially removing the isolation insulating layer 130, and the first silicon layer 113A. The width Wa3 of the top of the opening 117 is in a range from about 10 nm to about 20 nm, the width Wa4 of the bottom of the opening 117 is in a range from about 15 nm to about 30 nm, and the depth Da2 of the opening 117 is in a range from about 60 nm to about 100 nm in some embodiments. In one embodiment, the width Wa4 of the bottom of the opening 117 is greater than the width Wa3 of the top of the opening 117. However, the width of the bottom of the opening 117 may be the same as or smaller than the width of the top of the opening 117. The cross sectional shape of the opening 117 may be trapezoid, reverse-trapezoid, rectangular or a barreled shape. On the bottom of the opening, an etched surface of the silicon layer 113A is exposed.

Then, a SiGe layer 115A is epitaxially grown on the exposed surface of the silicon layer 113A so as to fill the opening 117. Subsequently, an unnecessary SiGe layer and the protective hard mask 350 are removed by, for example, a CMP method, as shown in FIG. 27.

Figure 27:
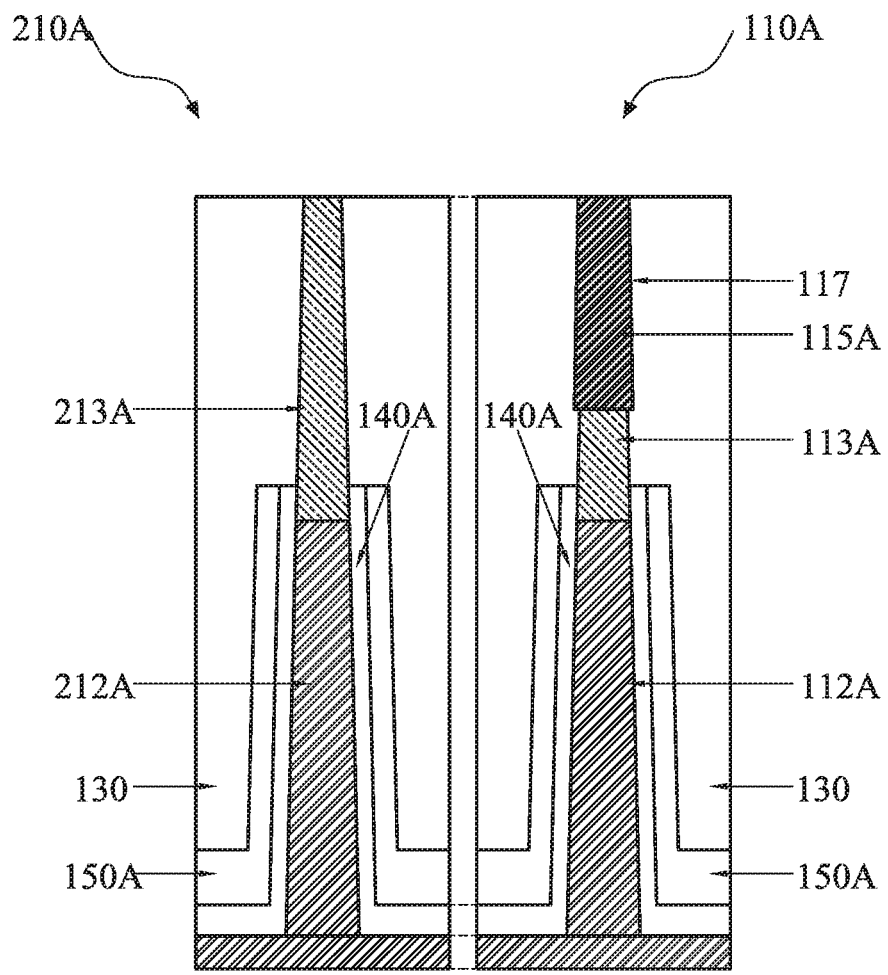

After the fin structures 110A, 210A are formed as shown in FIG. 27, the gate structure as shown in FIG. 15 is formed and one or more subsequent operations may be performed associated with the gate structure.

The various embodiments described herein offer several advantages over the existing art. For example, in the present disclosure, when the $SiO_2$ protective layer covers the SiN protective layer, it is possible to etch the SiN protective layer using a wet etching process, thereby removing a part of the SiN protective layer to have less residue compared with using a dry etching process. In addition, in the subsequent etching back process of the SiN protective layer, better selectivity between SiN and $SiO_2$ can be achieved in a wet etching process compared to a dry etching process. Damage of the pad oxide layer and peeling or collapse of the silicon nitride mask layer in the hard mask patterns can be effectively prevented during the etching back process of the SiN protective layer. Further, it is possible to control the width of the fin structure for the n-channel and p-channel Fin FET more precisely due to less damage in the hard mask patterns.

It will be understood that not all advantages have been necessarily discussed herein, no particular advantage is required for all embodiments, and other embodiments may offer different advantages.

In accordance with one aspect of the present disclosure, a semiconductor device includes a fin structure for a fin field effect transistor (FET). The fin structure includes a base layer protruding from a substrate, an intermediate layer disposed over the base layer and an upper layer disposed over the intermediate layer. The fin structure further includes a first protective layer and a second protective layer made of a different material than the first protective layer. The intermediate layer includes a first semiconductor layer disposed over the base layer, the first protective layer covers at least side walls of the first semiconductor layer and the second protective layer covers at least side walls of the first protective layer.

In accordance with another aspect of the present disclosure, a semiconductor device includes a first fin structure for a first FET and a second fin structure for a second fin FET. The first fin structure includes a first base layer protruding from a substrate, a first intermediate layer disposed over the first base layer and a first channel layer disposed over the first intermediate layer. The first fin structure also includes a first protective layer and a second protective layer made of a different material than the first protective layer. The second fin structure includes a second base layer protruding from the substrate, a second intermediate layer disposed over the second base layer and a second channel layer disposed over the second intermediate layer. The second fin structure also includes a third protective layer covering side walls of the second base layer, side walls of the second intermediate layer and side walls of the second channel layer, and a fourth protective layer made of a different material than the third protective layer. The first channel layer is made of SiGe. The first intermediate layer includes a first semiconductor layer disposed over the first base layer and a second semiconductor layer disposed over the first semiconductor layer. The first protective layer covers side walls of the first base layer, side walls of the first semiconductor layer and side walls of a part of the second semiconductor layer. The second protective layer covers at least side walls of the first protective layer and the fourth protective layer covers at least side walls of the third protective layer.

In accordance with yet another aspect of the present disclosure, a method for manufacturing a semiconductor device includes the following steps. A fin structure including a lower layer, an intermediate layer disposed over the lower layer and an upper layer disposed over the intermediate layer is formed. A first protective layer is formed over at least side walls of the fin structure. A second protective layer is formed over at least side walls of the fin structure to cover side walls of the intermediate layer. The second protective layer is made of a different material than the first protective layer. An upperpart of the second protective layer is removed so that a lower part of the second protective layer remains and an upper part of the first protective layer is exposed. A part of the exposed upper part of the first protective layer is removed so that a lower part of the first protective layer remains and covered by the remaining lower part of the second protective layer. An isolation insulating layer is formed so that the fin structure with the first protective layer and the second protective layer is embedded in the isolation insulating layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a fin structure including a lower layer, an intermediate layer disposed over the lower layer and an upper layer disposed over the intermediate layer;
   forming a first protective layer on sidewalls of the fin structure, wherein the first protective layer is a dielectric material to protect the fin structure from oxidizing;
   forming a second protective layer on sidewalls of the first protective layer to cover sidewalls of the first protective layer, wherein the second protective layer is a dielectric material to protect the first protective layer and the fin structure from damage, the second protective layer being made of a different material than the first protective layer;
   forming a sacrificial layer so that the fin structure covered by the first and second protective layers is embedded in the sacrificial layer;
   removing an upper part of the sacrificial layer so that the upper part of second protective layer is exposed;
   removing the upper part of the second protective layer so that a lower part of the second protective layer remains and an upper part of the first protective layer is exposed;
   removing a remaining part of the sacrificial layer;
   removing a part of the exposed upper part of the first protective layer so that a lower part of the first protective layer remains and is covered by the remaining lower part of the second protective layer; and
   after the part of the exposed upper part of the first protective layer is removed, forming an isolation insulating layer so that the fin structure with the second protective layer and the first protective layer is embedded in the isolation insulating layer.

2. The method of claim 1, wherein the sacrificial layer is a polymer based material layer.

3. The method of claim 1, wherein a difference between a height of the remaining lower part of the first protective layer and a height of the remaining lower part of the second protective layer is between 0.1 nm to 2 nm.

4. The method of claim 1, wherein the remaining lower part of the first protective layer remains on sidewalls of the lower layer, the sidewalls of the intermediate layer and sidewalls of a bottom part of the upper layer of the fin structure.

5. The method of claim 1, wherein the intermediate layer is made of SiGe.

6. The method of claim 1, wherein one of the first and second protective layers is made of silicon nitride.

7. The method of claim 1, further comprising:
   recessing the isolation insulating layer by such an amount that a part of the upper layer is exposed and the first and second protective layer are not exposed; and
   forming a gate structure over the exposed part of the upper layer.

8. The method of claim 1, further comprising:
   removing a part of the upper layer of the fin structure and the isolation insulating layer so that an opening is formed in the isolation insulating layer;
   forming a channel layer in the opening;
   recessing the isolation insulating layer by such an amount that a part of the channel layer is exposed and the first and second protective layer are not exposed; and
   forming a gate structure over the exposed part of the channel layer.

9. A method for manufacturing a semiconductor device, comprising:
   forming a first fin structure and a second fin structure, each of the first and second fin structures including a lower layer, an intermediate layer disposed over the lower layer and an upper layer disposed over the intermediate layer;
   forming an oxide layer on sides of the intermediate layer of the second fin structure, while protecting the intermediate layer of the first fin structure from oxidization;
   forming a first protective layer over the second fin structure having the oxide layer on the intermediate layer and over the first fin structure;
   forming a second protective layer over the first protective layer formed on the first and second fin structures;
   removing an upper part of the second protective layer so that a lower part of the second protective layer remains and an upper part of the first protective layer is exposed;
   removing a part of the exposed upper part of the first protective layer so that a lower part of the first protective layer remains and is covered by the remaining lower part of the second protective layer; and
   after the part of the exposed upper part of the first protective layer is removed, forming an isolation insulating layer so that the first and second fin structures with the second protective layer and the first protective layer are embedded in the isolation insulating layer.

10. The method of claim 9, wherein after the part of the exposed upper part of the first protective layer is removed,
    the first and second protective layers remain over sidewalls of the lower layer, sidewalls of the oxide layer on and sidewalls of a bottom part of the upper layer of the second fin structure, and
    the first and second protective layers remains over sidewalls of the lower layer, sidewalls of the intermediate layer and sidewalls of a bottom part of the upper layer of the first fin structure.

11. The method of claim 10, further comprising:
    removing a part of the upper layer of the first fin structure and the isolation insulating layer so that an opening is formed in the isolation insulating layer;
    forming a channel layer in the opening;
    recessing the isolation insulating layer by such an amount that a part of the channel layer is exposed and the first and second protective layer are not exposed; and forming a gate structure over the exposed part of the channel layer.

12. The method of claim 11, wherein the channel layer includes SiGe.

13. The method of claim 11, wherein the first and second protective layers do not cover sidewalls of the channel layer and are spaced apart from the channel layer.

14. The method of claim 9, wherein the intermediate layer includes SiGe.

15. The method of claim 9, wherein the removing the upper part of the second protective layer includes:
forming a sacrificial layer so that the first and second fin structures with the first and second protective layers are embedded in the sacrificial layer;
reducing a thickness of the sacrificial layer;
removing the upper parts of the second protective layer; and
removing the sacrificial layer of which thickness has been reduced.

16. The method of claim 15, wherein the sacrificial layer is a polymer based material layer.

17. The method of claim 9, further comprising:
recessing the isolation insulating layer by such an amount that a part of the upper layer of the second fin structure is exposed and the first and second protective layer are not exposed; and
forming a gate structure over the exposed part of the upper layer of the second fin structure.

18. A method for manufacturing a semiconductor device, comprising:
forming a fin structure;
forming a first protective layer on sidewalls of the fin structure;
forming a second protective layer on sidewalls of the first protective layer to cover sidewalls of the first protective layer, the second protective layer being made of a different material than the first protective layer;
removing an upper part of the second protective layer so that a lower part of the second protective layer remains and an upper part of the first protective layer is exposed;
removing a part of the exposed upper part of the first protective layer so that a lower part of the first protective layer remains and is covered by the remaining lower part of the second protective layer;
after the part of the exposed upper part of the first protective layer is removed, forming an isolation insulating layer so that the fin structure with the second protective layer and the first protective layer is embedded in the isolation insulating layer;
removing a part of the upper layer of the fin structure and the isolation insulating layer so that an opening is formed in the isolation insulating layer;
forming a channel layer in the opening;
recessing the isolation insulating layer by such an amount that a part of the channel layer is exposed and the first and second protective layer are not exposed; and
forming a gate structure over the exposed part of the channel layer.

19. The method of claim 18, wherein the first protective layer is made of silicon nitride and the second protective layer is made of silicon oxide.

20. The method of claim 1, wherein the sacrificial layer is an organic material layer.

21. The method of claim 18, wherein the sacrificial layer is an organic material layer.

* * * * *